United States Patent
Saito et al.

(10) Patent No.: US 8,330,190 B2
(45) Date of Patent: Dec. 11, 2012

(54) SEMICONDUCTOR DEVICE

(75) Inventors: Noriaki Saito, Yokohama (JP); Toyoji Sawada, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 243 days.

(21) Appl. No.: 12/715,826

(22) Filed: Mar. 2, 2010

(65) Prior Publication Data

US 2010/0224997 A1 Sep. 9, 2010

(30) Foreign Application Priority Data

Mar. 6, 2009 (JP) .................................... 2009-53197

(51) Int. Cl.
*H01L 27/10* (2006.01)
(52) U.S. Cl. .................. 257/211; 257/758; 257/E23.145
(58) Field of Classification Search .................. 257/211, 257/758, 760, 762, 774, 778, E23.145
See application file for complete search history.

(56) References Cited

U.S. PATENT DOCUMENTS

| 7,190,077 B2 | 3/2007 | Bauer et al. |
| 2003/0054626 A1 | 3/2003 | Kobayashi et al. |
| 2005/0242374 A1 | 11/2005 | Bauer et al. |
| 2008/0083923 A1 | 4/2008 | Nakauchi |
| 2008/0083992 A1* | 4/2008 | Lin et al. ........................ 257/774 |

FOREIGN PATENT DOCUMENTS

| JP | 2005-522019 A | 7/2005 |
| JP | 2005-251832 A | 9/2005 |
| JP | 2006-502561 A | 1/2006 |
| JP | 2008-098225 A | 4/2008 |

* cited by examiner

*Primary Examiner* — Hoai V Pham
(74) *Attorney, Agent, or Firm* — Westerman, Hattori, Daniels & Adrian, LLP

(57) ABSTRACT

A semiconductor device includes a first metal layer disposed on a semiconductor substrate; an insulating layer disposed on the first metal layer; and a second metal layer disposed on the insulating layer and having an electrode pad surface exposed to the outside, wherein a recess is disposed in the insulating layer and the second metal layer; and at least the second metal layer is disposed in the recess of the insulating layer.

12 Claims, 31 Drawing Sheets

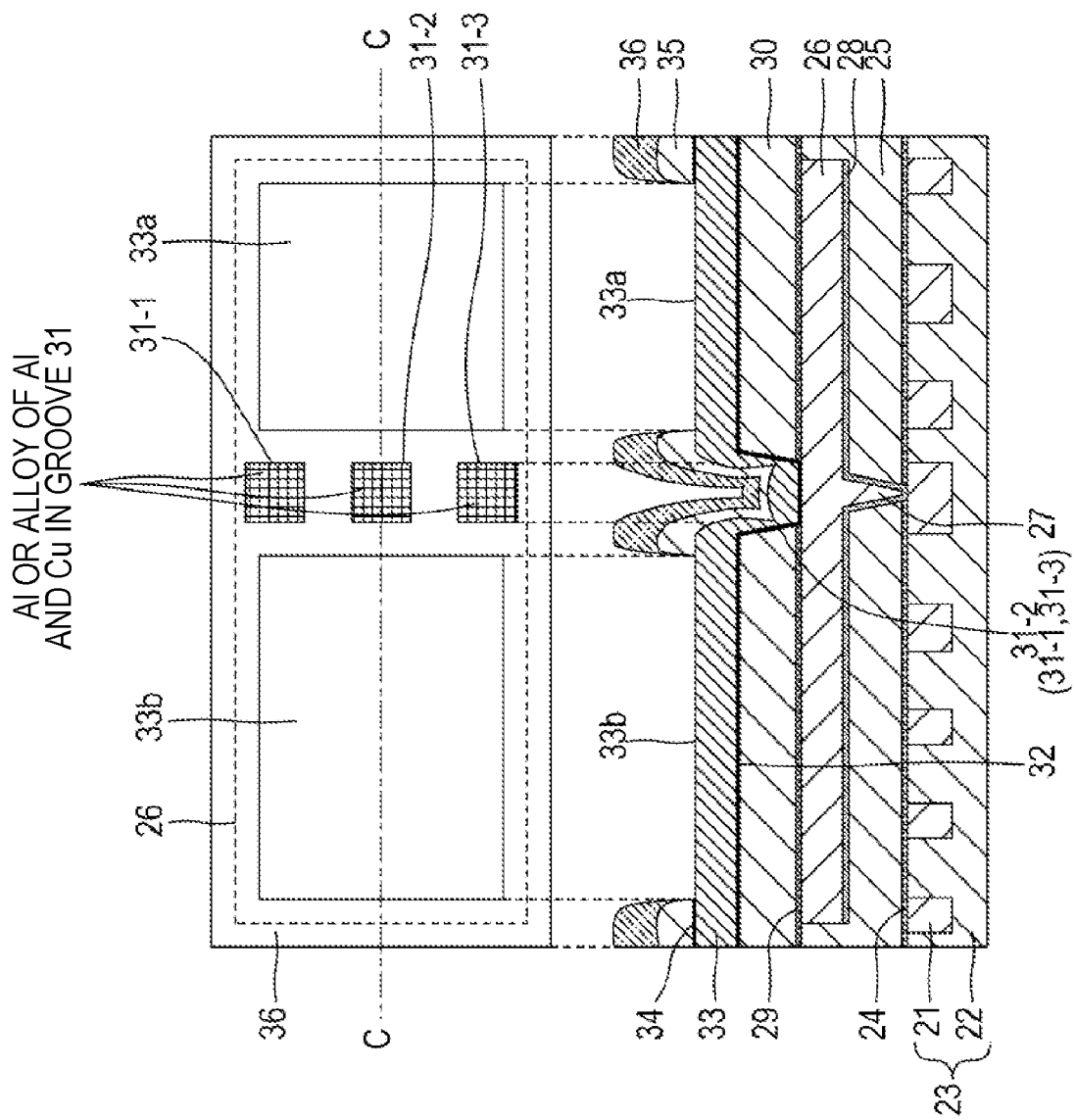

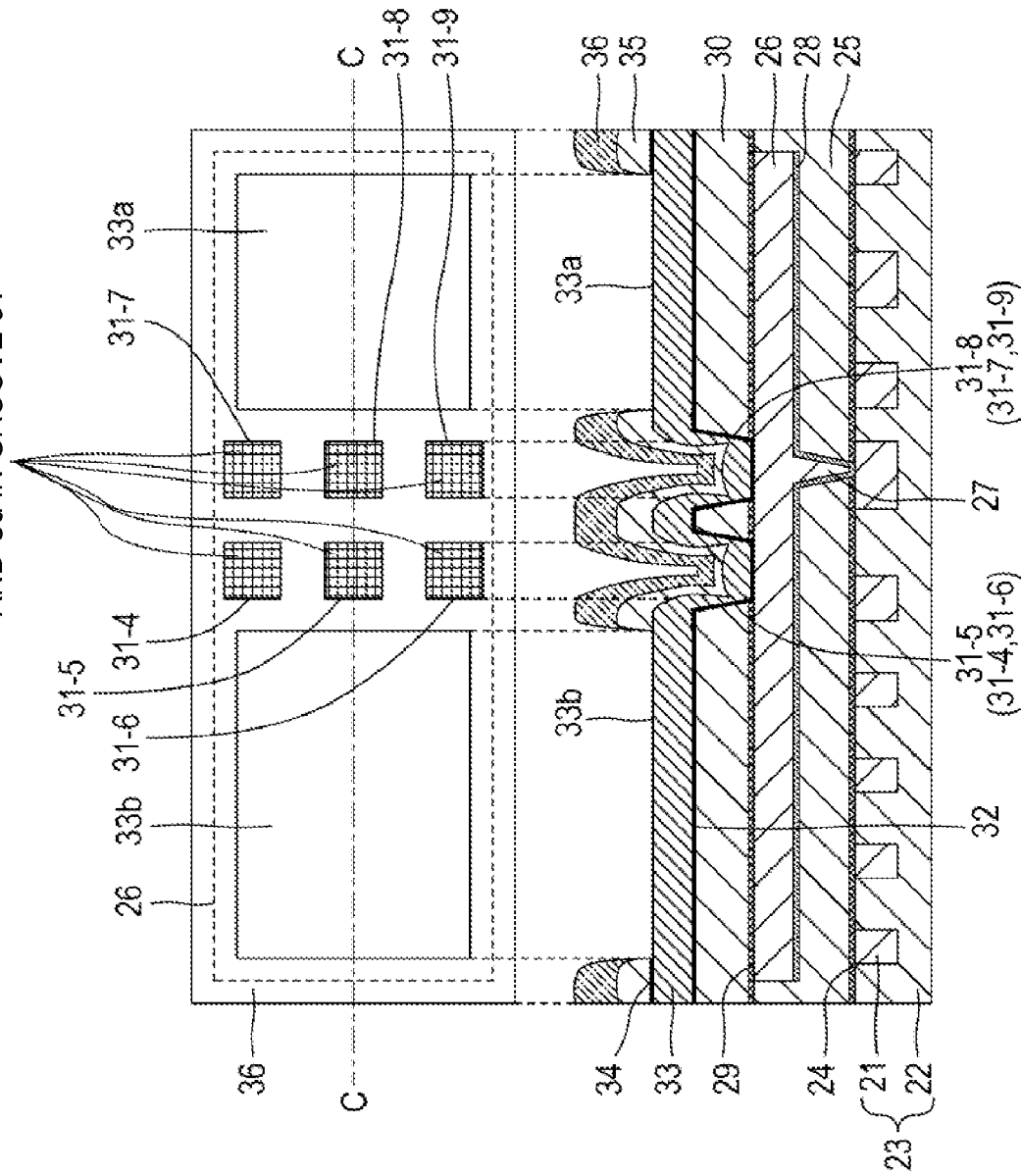

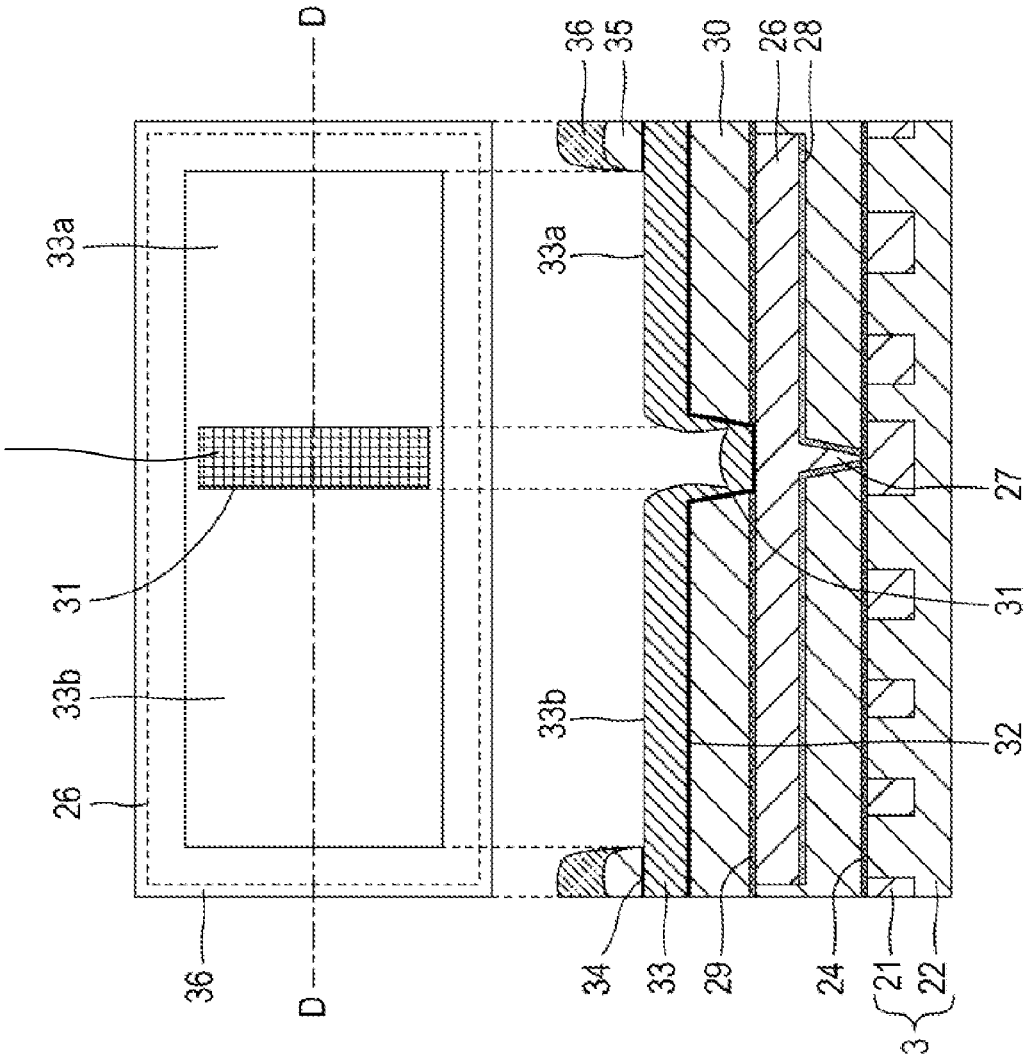

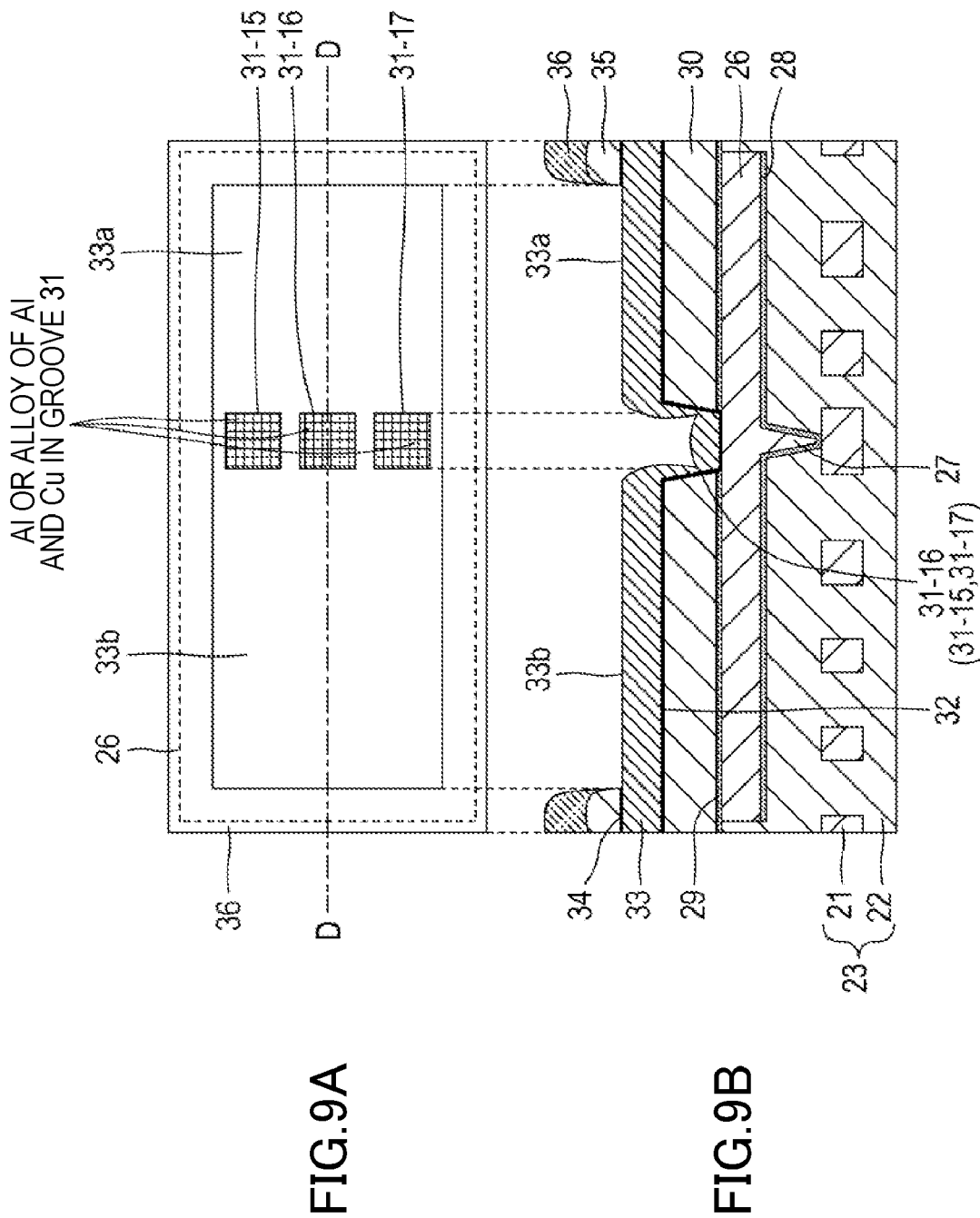

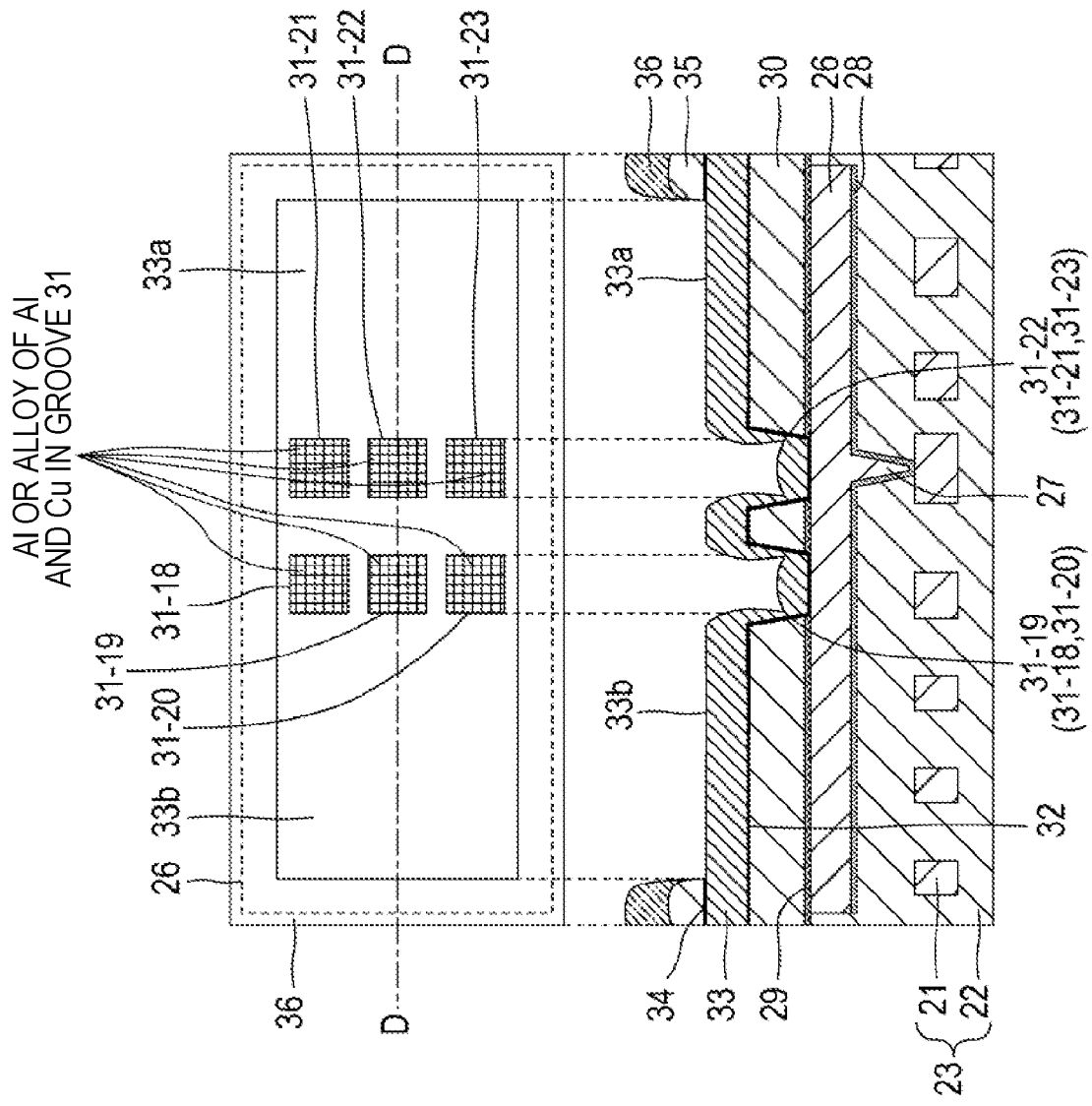

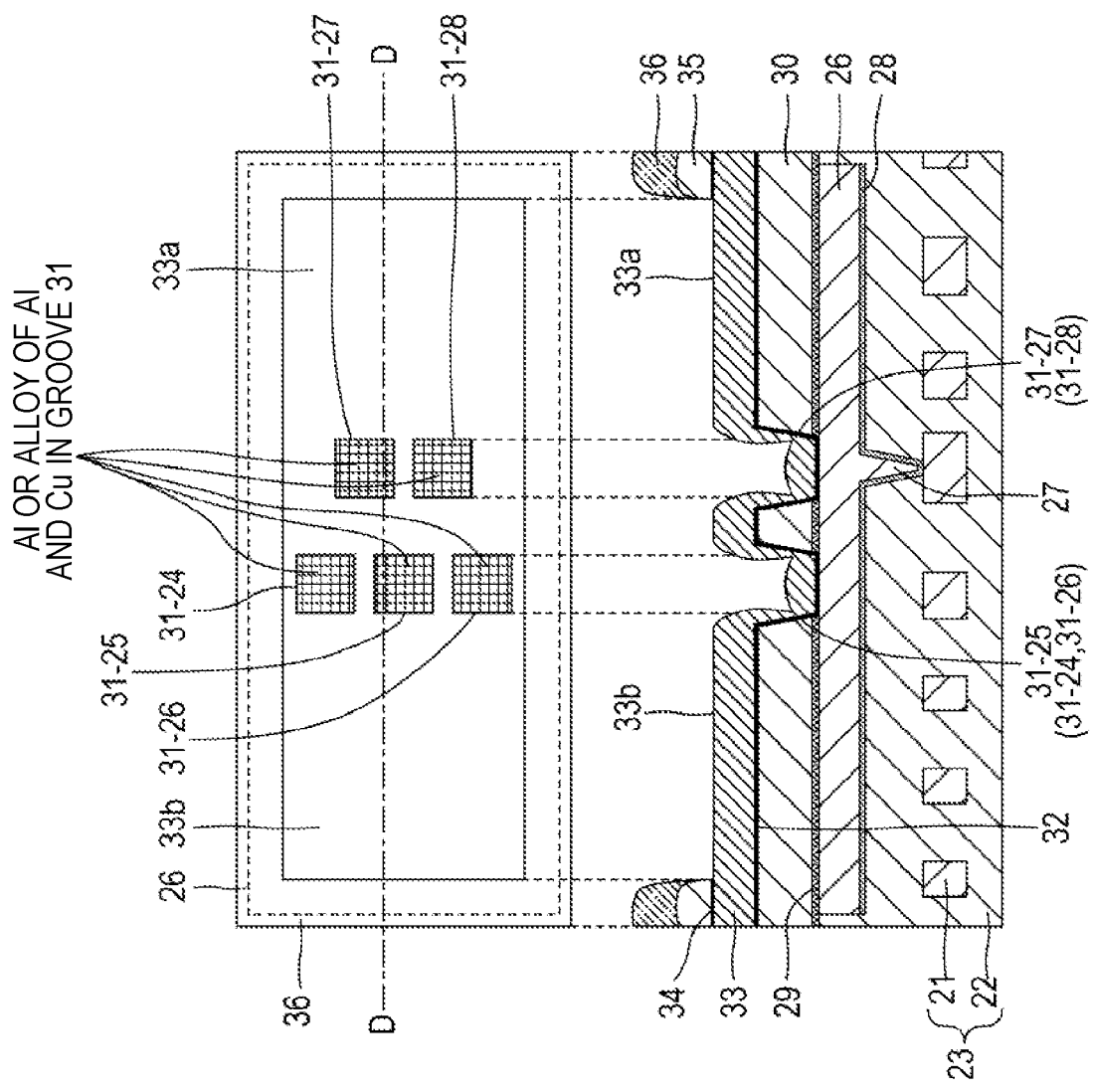

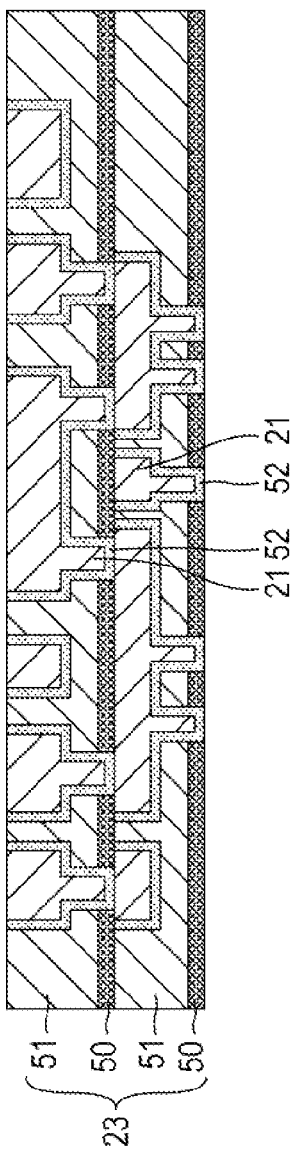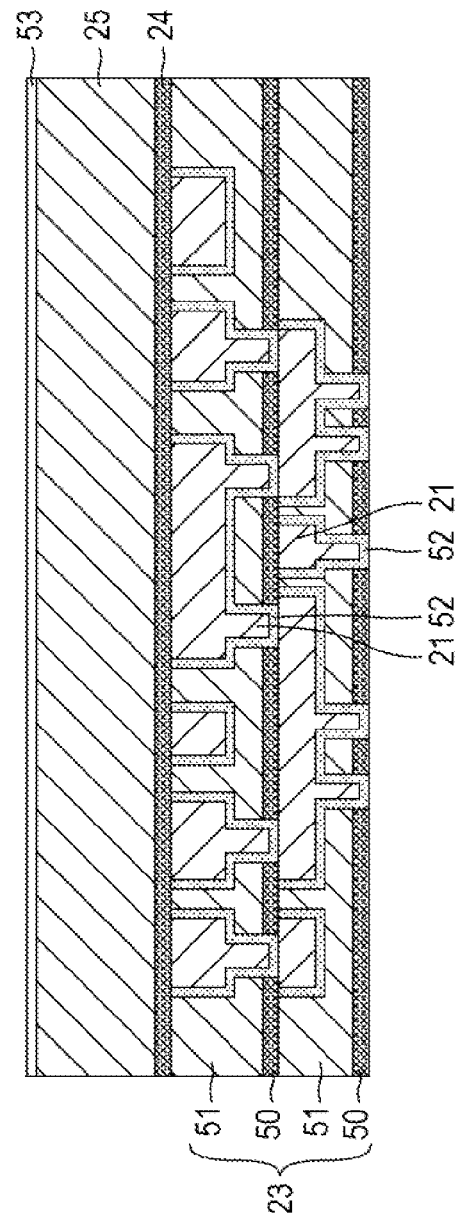

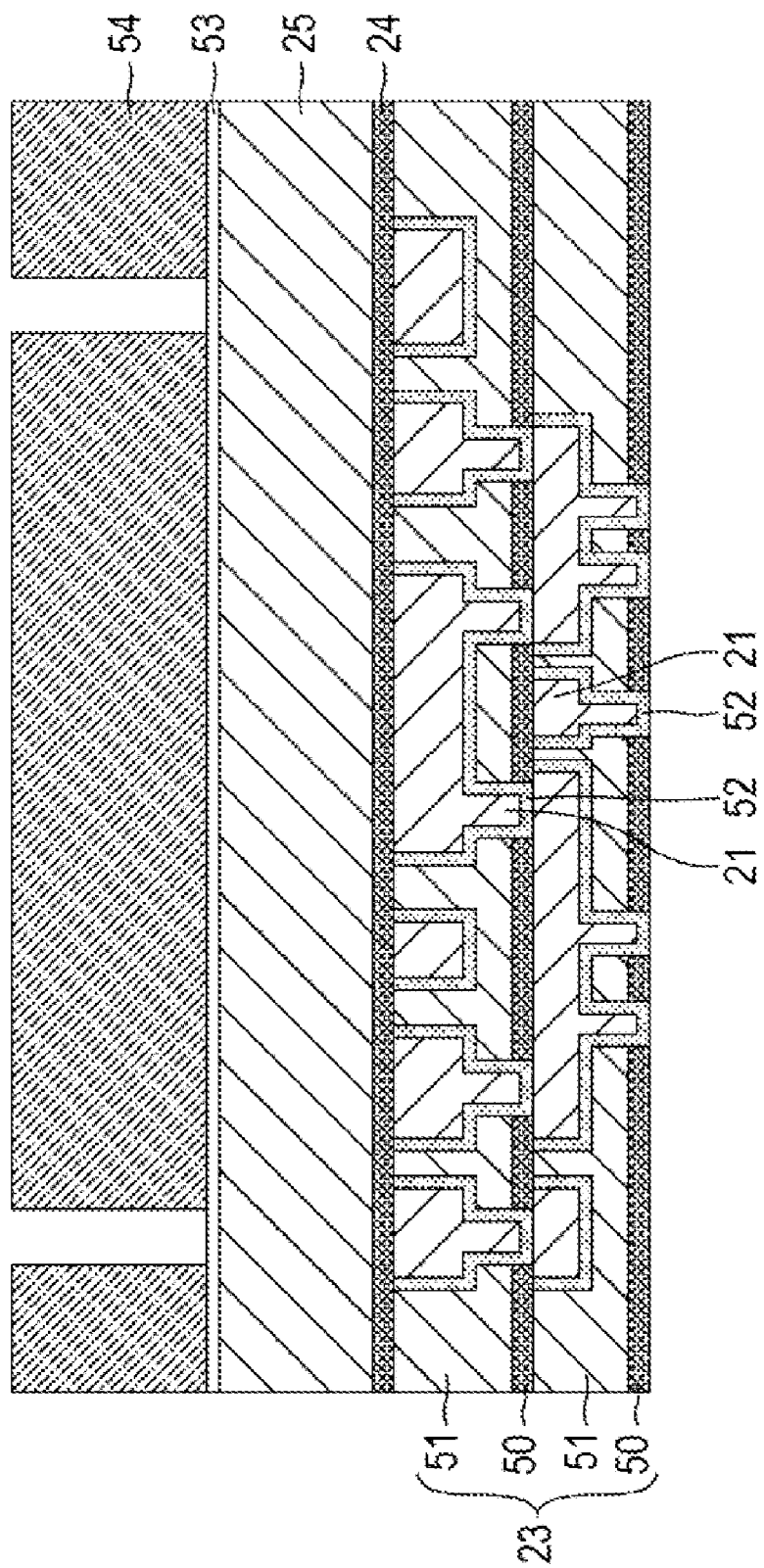

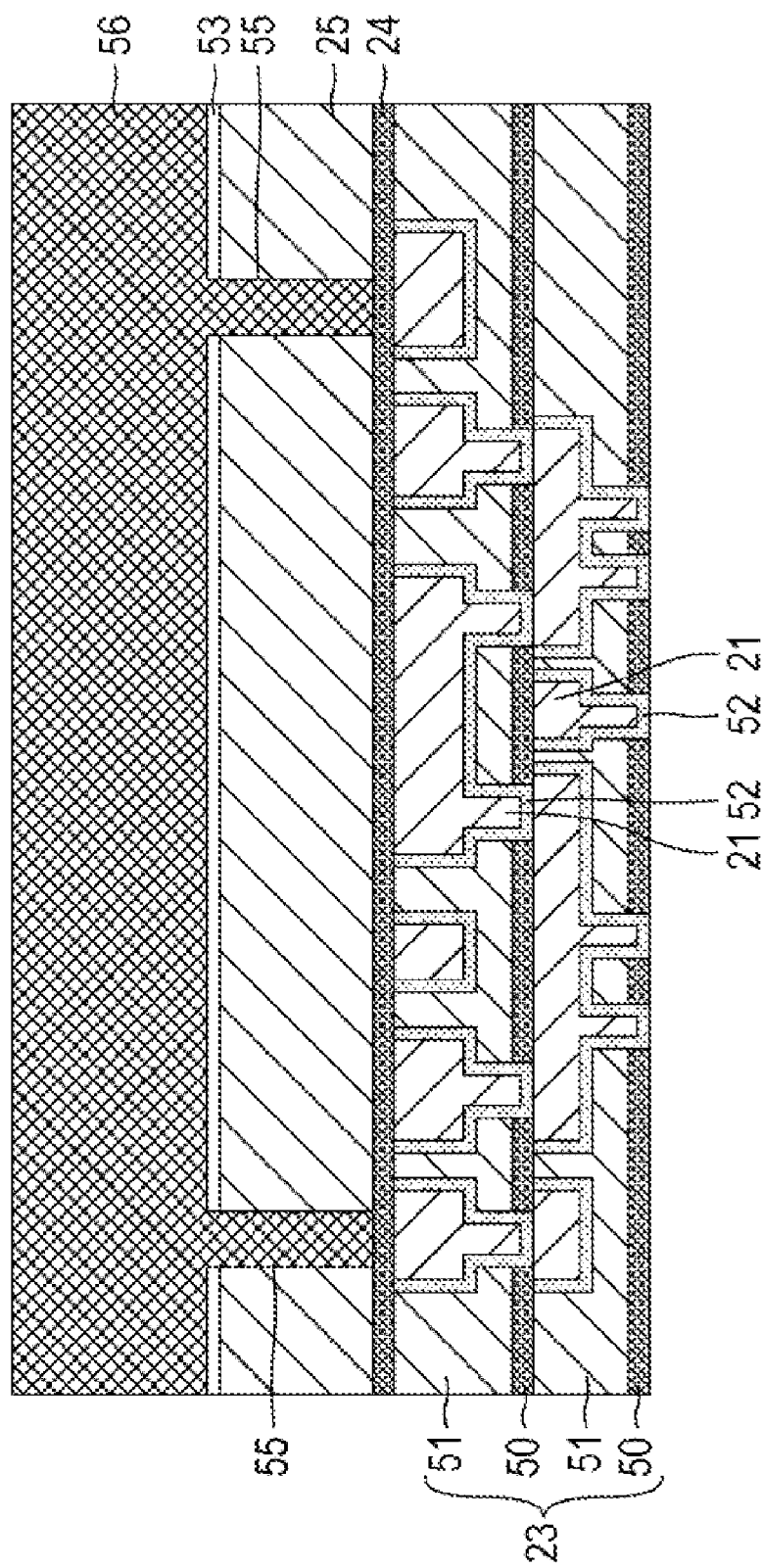

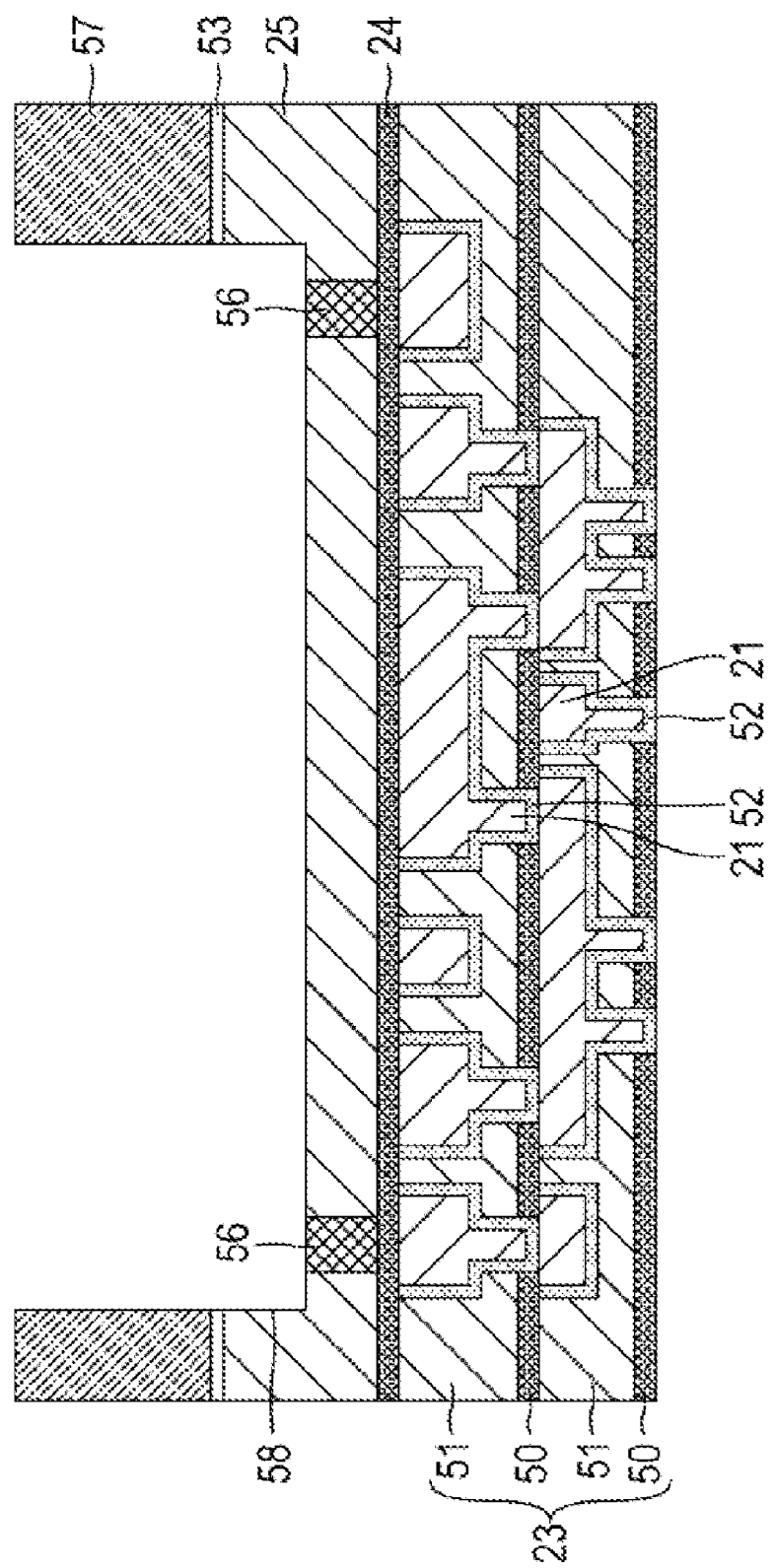

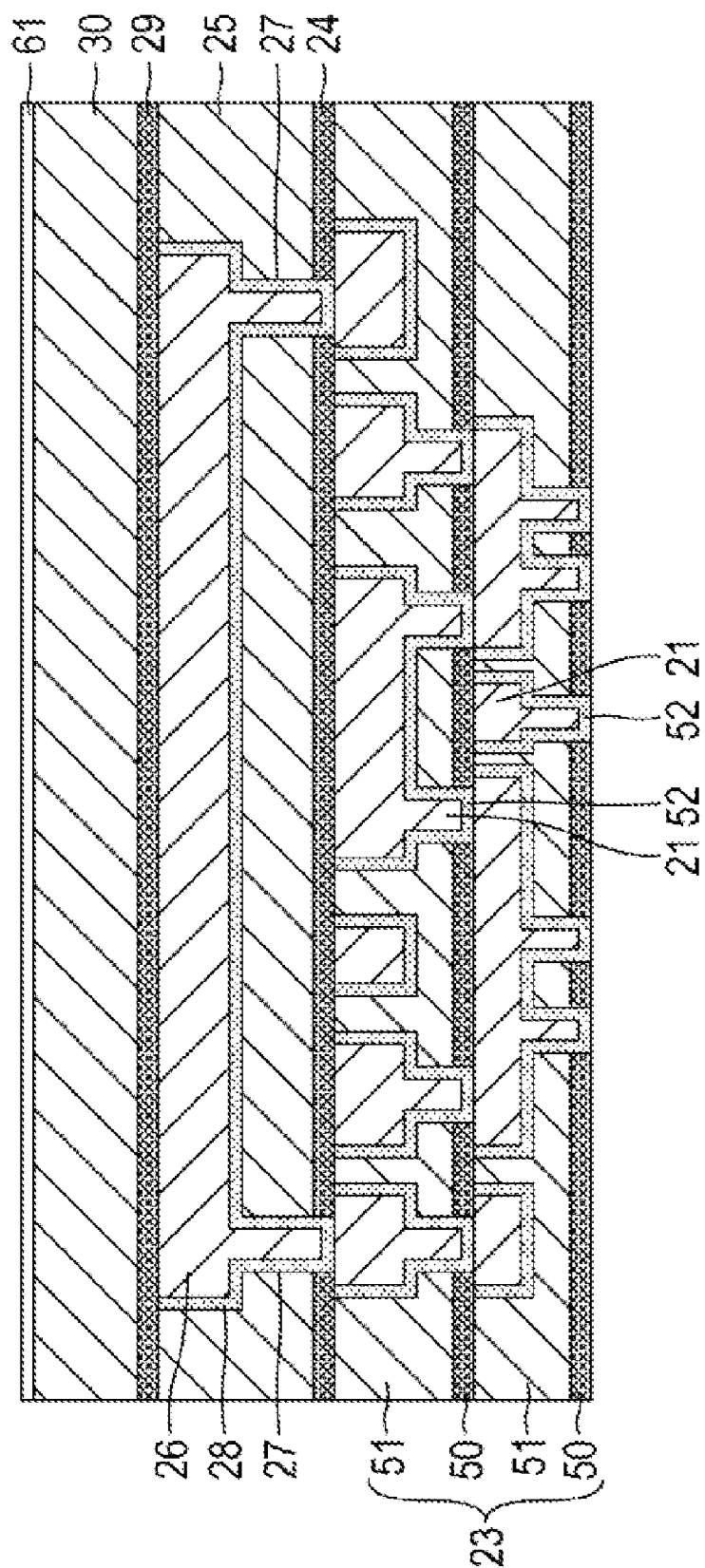

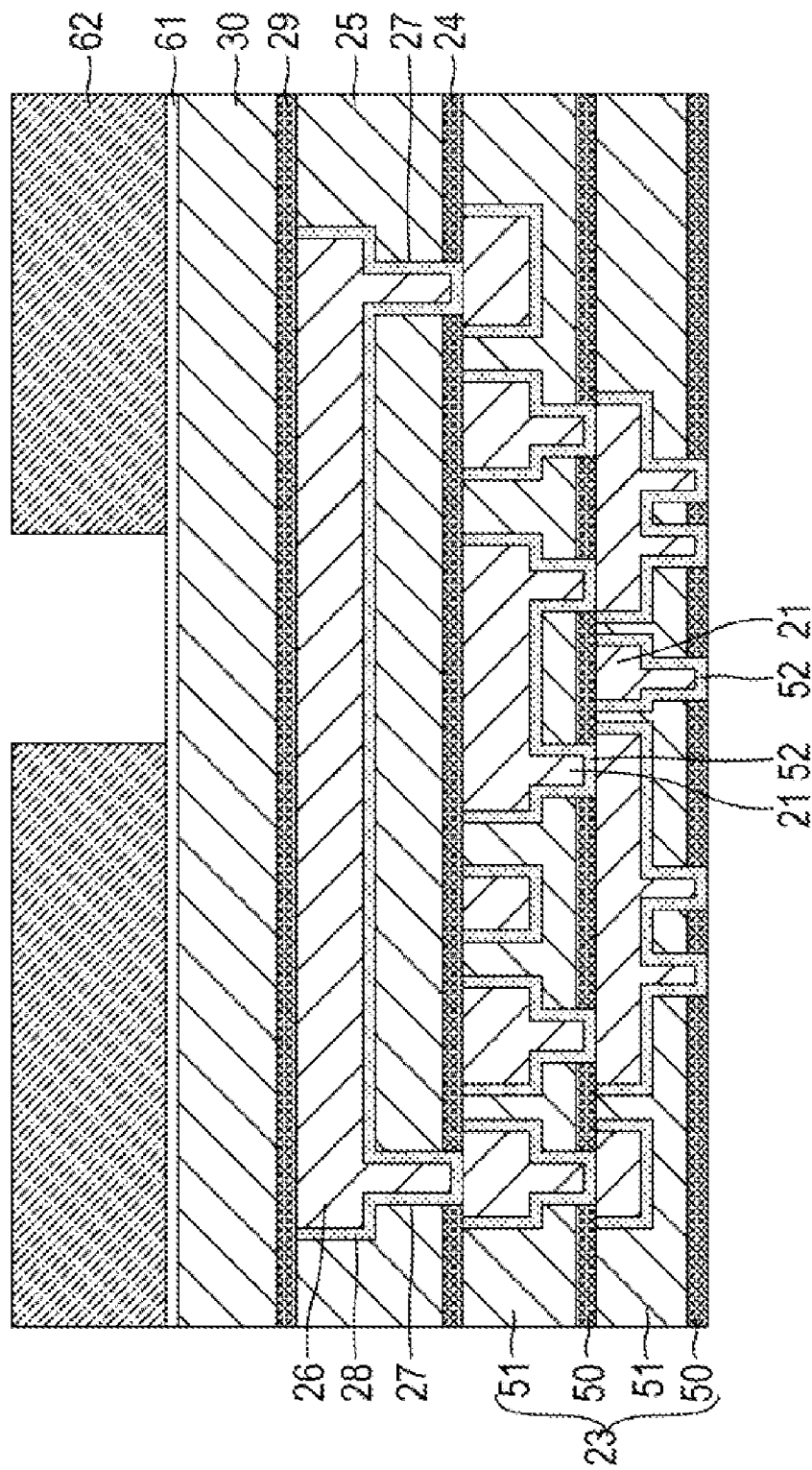

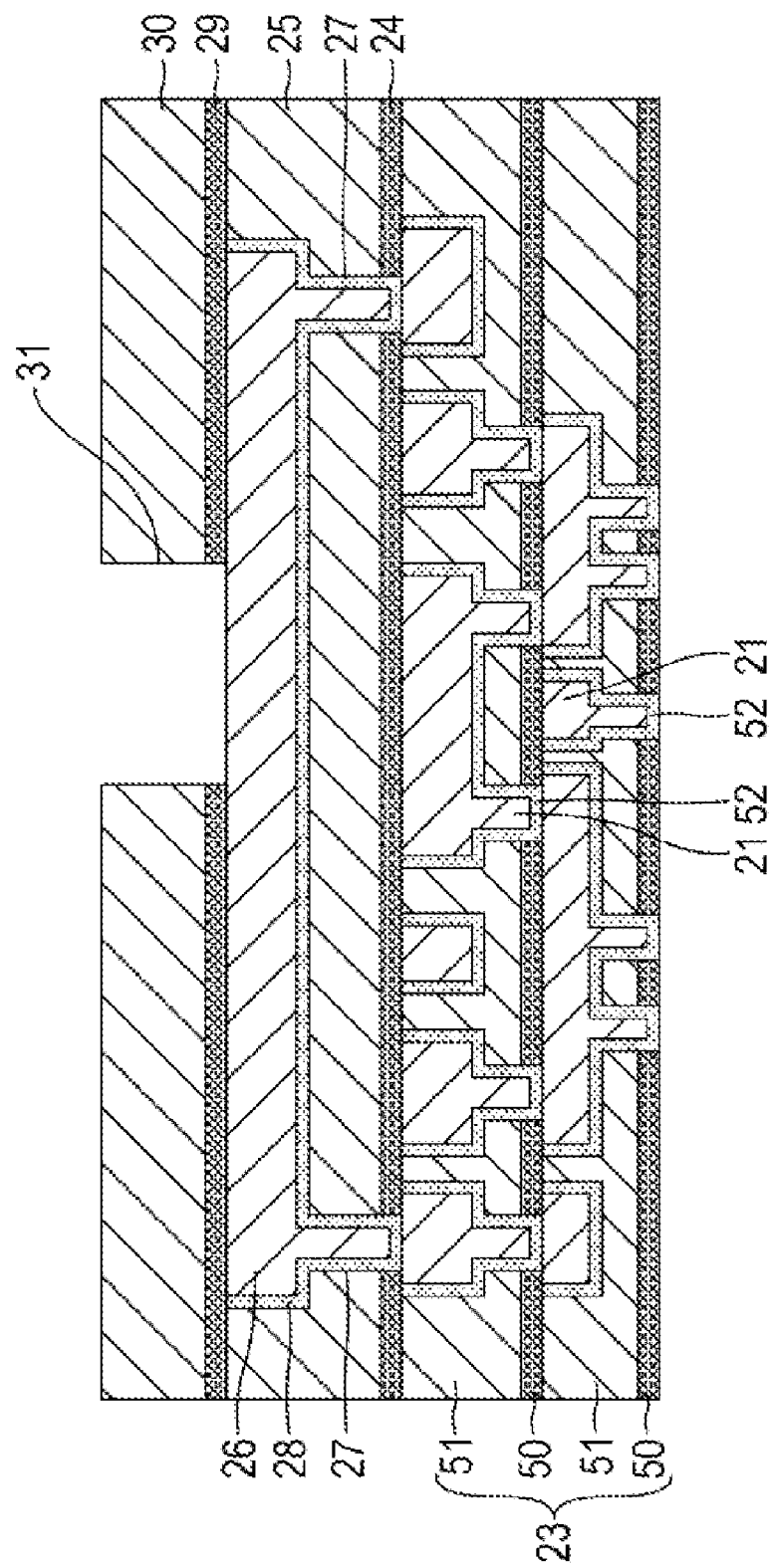

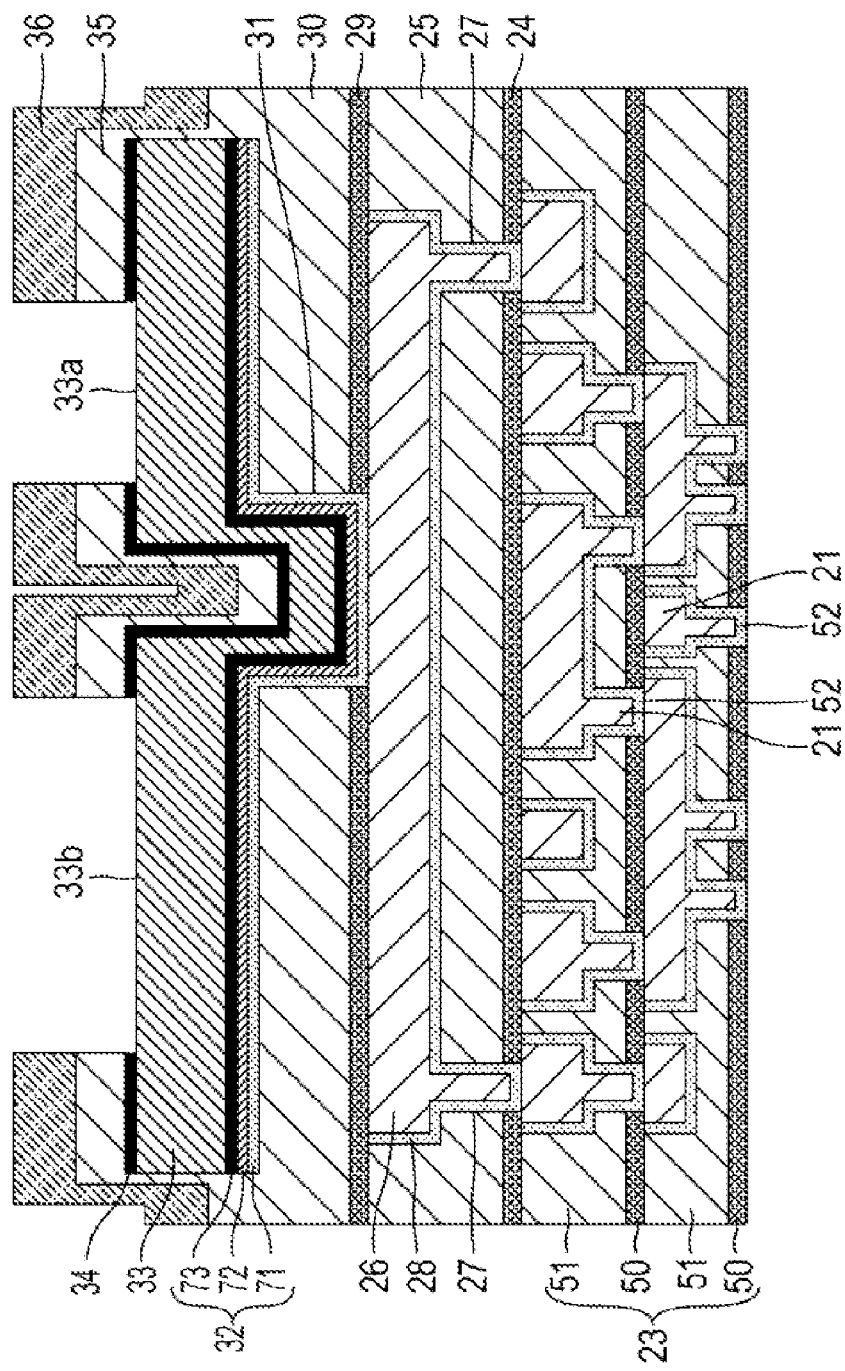

SEMICONDUCTOR DEVICE

CROSS-REFERENCE TO RELATED APPLICATIONS

This application is based upon and claims the benefit of priority of the prior Japanese Patent Application No. 2009-53197, filed on Mar. 6, 2009, the entire contents of which are incorporated herein by reference.

FIELD

The present invention relates to a semiconductor device, and more particularly, to a semiconductor device provided with electrode pads.

BACKGROUND

In the manufacture of semiconductor device products, in order to detect defective semiconductor elements early so that manufacturing costs are reduced and productivity is improved, a function test is performed in which the semiconductor elements are connected to a tester and circuits are driven.

In such a function test, in order to temporarily provide wiring from the tester to electrode pads disposed on semiconductor elements, a probe card, in which probe needles are arranged in advance so as to correspond to the arrangement of the electrode pads of the semiconductor elements to be tested, is used as a card for testing semiconductor elements. Specifically, the examination of electrical characteristics of the semiconductor elements to be tested (i.e., probing test) is conducted by a method in which the probe needles of the probe card are brought into contact with the electrodes pads of the semiconductor elements to be tested using a driving device referred to as a prober.

Subsequently, the electrode pads of the semiconductor elements which have been determined to be non-defective in such a probing test are connected to inner leads or electrode terminals of a wiring substrate on which the semiconductor elements are to be mounted, using bonding wires made up of gold (Au) or the like. Namely, wire bonding is performed.

With regard to such a technique, Japanese National Publication of International Patent Application No. 2005-522019 discloses a structure in which a planarized combination of copper and silicon oxide features is provided in a bond pad region to form bond pads, and the silicon oxide features are etched back to provide a plurality of recesses in the copper in the bond pad region.

Furthermore, Japanese National Publication of International Patent Application No. 2006-502561 discloses a structure, in which beneath a pad metal, at least upper two metal layers contain at least two adjacent conductor tracks.

Furthermore, Japanese Laid-open Patent Publication No. 2005-251832 discloses a structure in which an interlayer insulation film underlying a pad surface layer is selectively left and when aluminum which forms an electrode is vapor-deposited thereon, selectively left portions rise or sink to form a recognizable pattern artificially on the surface of the electrode pad.

Furthermore, Japanese Laid-open Patent Publication No. 2008-098225 discloses a structure including a probe contact region which has a lower layer including wide slit vias and the surface of which is depressed, and a bonding region which has a lower layer including narrow slit vias, thus allowing the probe contact region and the bonding region to be clearly distinguished.

However, in the example illustrated in FIGS. 3A and 3B, because of limitations in the process of manufacturing semiconductor elements, such as the accuracy of photomasks used for exposing circuit patterns, a bonding region 13a and a test region 13b are disposed with a predetermined distance therebetween. Consequently, in the example illustrated in FIGS. 3A and 3B, it is not possible to decrease the overall length of the electrode pad, thus increasing the size of the semiconductor elements, which makes it difficult to reduce the manufacturing costs of semiconductor devices.

Furthermore, the bonding pad structure described in Japanese Laid-open Patent Publication No. 2005-251832 is a two-layered metal structure including a wiring metal layer and an uppermost metal layer disposed on the wiring metal layer. Usually, a wiring portion having a different potential is provided below the pad structure.

In such a structure, when stress is applied onto the uppermost metal layer during a probing test or a wire bonding process, although the uppermost metal layer and the wiring metal layer change shape, cracks may occur in the interlayer insulation film and the insulation film between wires located below the wiring metal layer. If such cracks extend to the wiring portion, short-circuiting may occur. In order to prevent this problem, it is necessary to form a metal layer between the wiring metal layer and the interlayer insulation film. However, formation of the metal layer increases the number of manufacturing steps, resulting in a difficulty in reducing the manufacturing costs.

Furthermore, in the structure described in Japanese Laid-open Patent Publication No. 2008-098225, the wide slit vias and narrow slit vias in which a metal, such as tungsten (W) or copper (Cu), is embedded, and an insulating film are disposed directly under the banding pad. Consequently, as in the structure described in Japanese Laid-open Patent Publication No. 2005-251832, when stress is applied onto the bonding pad, cracks may occur in the insulating film, and the cracks may extend to the wiring portion, resulting in the occurrence of short-circuiting.

Under these circumstances, it is desired to realize a technique which makes it possible to easily check whether or not a needle mark extends to a bonding region during a probing test without increasing the size of semiconductor elements.

SUMMARY

According to one aspect of the invention, a semiconductor device includes a first metal layer disposed on a semiconductor substrate; an insulating layer disposed on the first metal layer; and a second metal layer disposed on the insulating layer and having an electrode pad surface exposed to the outside, wherein a recess is disposed in the insulating layer and the second metal layer; and at least the second metal layer is disposed in the recess of the insulating layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B are views illustrating a structure of an electrode pad of a semiconductor element according to a first modification example of the first embodiment of the present invention;

FIGS. 6A and 6B are views illustrating a structure of an electrode pad of a semiconductor element according to a second modification example of the first embodiment of the present invention;

FIGS. 8A and 8B are views illustrating a structure of an electrode pad of a semiconductor element according to a second embodiment of the present invention;

FIGS. 9A and 9B are views illustrating a structure of an electrode pad of a semiconductor element according to a first modification example of the second embodiment of the present invention;

FIGS. 10A and 10B are views illustrating a structure of an electrode pad of a semiconductor element according to a second modification example of the second embodiment of the present invention;

FIGS. 11A and 11B are views illustrating a structure of an electrode pad of a semiconductor element according to a third modification example of the second embodiment of the present invention;

FIGS. 12A and 12B are each a view illustrating a step of manufacturing an electrode pad of a semiconductor element according to an embodiment of the present invention;

FIG. 12C is a view illustrating a step of manufacturing the electrode pad of the semiconductor element according to the embodiment of the present invention;

FIG. 12E is a view illustrating a step of manufacturing the electrode pad of the semiconductor element according to the embodiment of the present invention;

FIG. 12H is a view illustrating a step of manufacturing the electrode pad of the semiconductor element according to the embodiment of the present invention;

FIG. 12M is a view illustrating a step of manufacturing the electrode pad of the semiconductor element according to the embodiment of the present invention;

FIG. 12N is a view illustrating a step of manufacturing the electrode pad of the semiconductor element according to the embodiment of the present invention;

FIG. 12O is a view illustrating a step of manufacturing the electrode pad of the semiconductor element according to the embodiment of the present invention;

FIG. 12U is a view illustrating a step of manufacturing the electrode pad of the semiconductor element according to the embodiment of the present invention.

DETAILED DESCRIPTION OF THE EMBODIMENTS

The embodiments of the present invention will be described below.

In recent years, along with the miniaturization of semiconductor devices, the pitch between electrode pads and the size of electrode pads have been reduced. For example, in the case where the pitch between electrode pads is 60 μm or less, a structure illustrated in FIG. 1 is employed.

Figure 1:
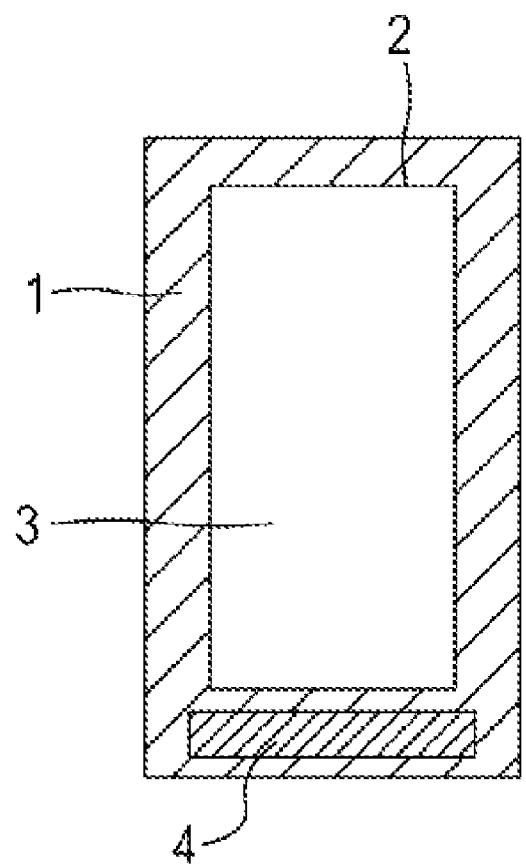
FIG. 1 is a plan view illustrating an electrode pad of a semiconductor element and a vicinity of the electrode pad.

FIG. 1 is a plan view illustrating an electrode pad of a semiconductor element and a vicinity of the electrode pad. In the structure illustrated in FIG. 1, an opening 2 having a substantially rectangular shape is formed in a silicon oxide film 1 made up of silicon dioxide ($SiO_2$) or the like disposed on a semiconductor substrate, and an electrode pad 3, for example, made up of aluminum (Al), is exposed.

A via 4 is formed in a layer under the electrode pad 3. The via 4 is, for example, filled with aluminum (Al), and may be visually observed from outside through the silicon oxide film 1. The electrode pad 3 and a wiring portion located below the electrode pad 3 are connected to each other through the via 4 filled with aluminum (Al).

Figure 2A:
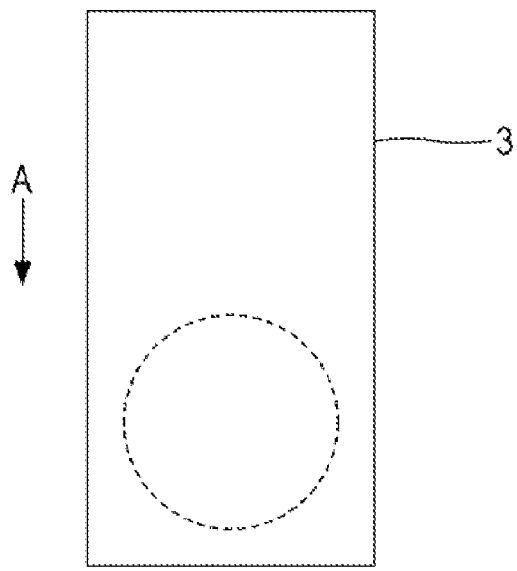
FIGS. 2A and 2B are each an enlarged view of the electrode pad illustrated in FIG. 1.
Figure 2B:
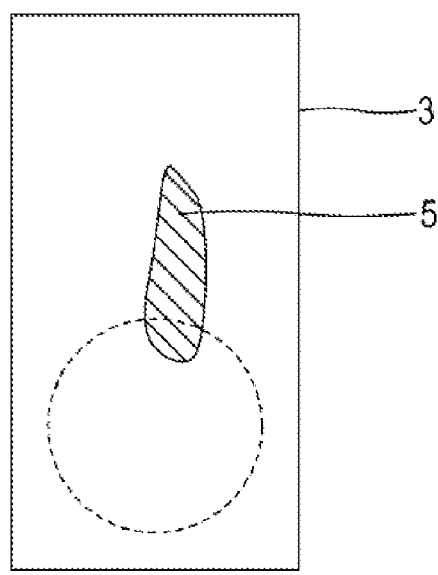

FIGS. 2A and 2B are each an enlarged view of the electrode pad 3 illustrated in FIG. 1. FIG. 2B illustrates a state in which a probing test has been performed on the electrode pad 3 illustrated in FIG. 2A. The electrode pad 3 includes a bonding region on which wire bonding is performed and a test region with which a probe needle is brought into contact in order to conduct a probing test. In each of FIGS. 2A and 2B, a portion indicated by the dotted line represents the bonding region, and a test region lies adjacent to the bonding region (on the upper side of the bonding region in each of FIGS. 2A and 2B).

When a probing test is carried out, for example, a cantilever probe needle is brought into contact with the electrode pad 3 and made to scrub the test region of the electrode pad 3 in a direction indicated by arrow A in FIG. 2A.

However, in the structure illustrated in FIG. 2A, the bonding region and the test region are not clearly separated, and it is difficult to control the amount of scrubbing of the probe needle. Consequently, as illustrated in FIG. 2B, there is a possibility that, during the probing test, the probe needle may extend beyond the test region and a needle mark 5 may extend to the bonding region indicated by the dotted line.

If the needle mark 5 extends to the bonding region, the surface of the electrode pad 3 may be roughened, resulting in separation of aluminum (Al) which is a constituent material of the electrode pad 3. In such a case, even if wire bonding is performed on the damaged surface of the electrode pad 3, an alloy layer between, for example, gold (Au) which makes up a bonding wire and aluminum (Al) which is a constituent material of the electrode pad 3 is not formed. Consequently, it is difficult to obtain a sufficient bonding strength for wire bonding.

In order to prevent a needle mark from extending to the bonding region, a method has been proposed in which a worker visually confirms whether or not the needle mark extends to the bonding region, either using a microscope or through an image taken by a CCD camera or the like.

However, in the example illustrated in FIGS. 2A and 2B, since a mark for distinguishing between the bonding region and the test region is not placed in the boundary between the two, it is difficult to visually confirm whether or not the needle mark extends to the bonding region.

Figure 3A:
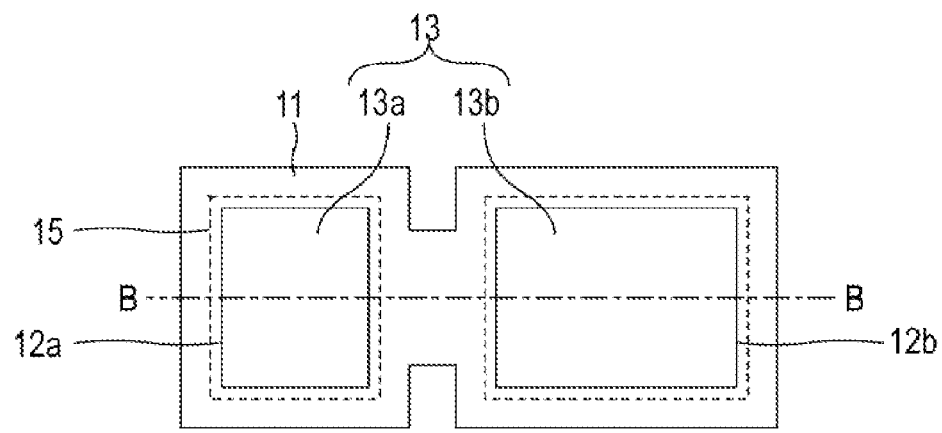
FIGS. 3A and 3B are views illustrating another example of an electrode pad of a semiconductor element.
Figure 3B:
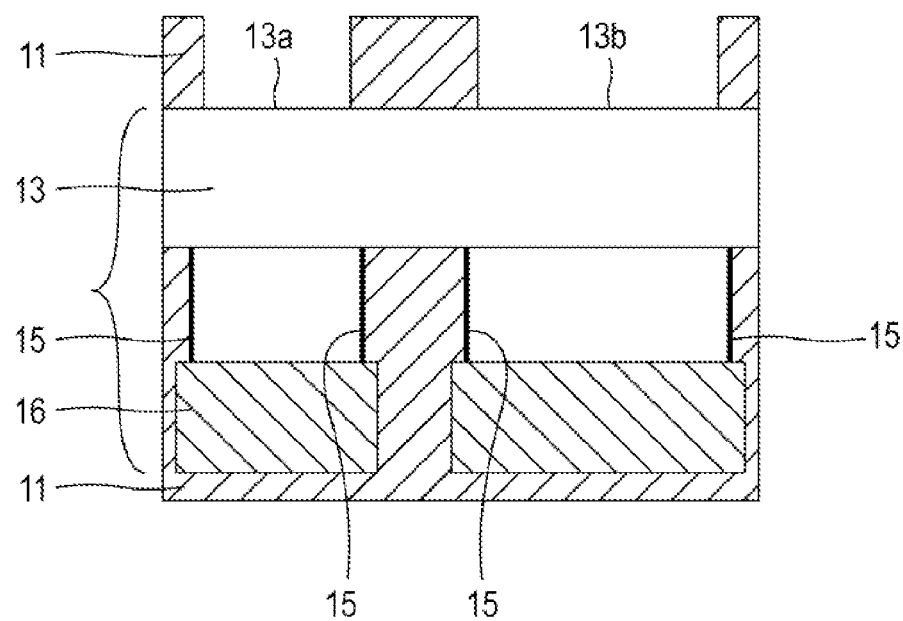

In order to address the problem described above, a structure illustrated in FIGS. 3A and 3B has been proposed. FIG. 3A is a plan view illustrating an electrode pad and a vicinity of the electrode pad, and FIG. 3B is a cross-sectional view taken along the chain line B-B of FIG. 3A. The portion below the pad portion is not illustrated to facilitate explanation.

In the example illustrated in FIGS. 3A and 3B, openings 12a and 12b each having a substantially rectangular shape are formed with a specific distance therebetween on a silicon oxide film 11 made up of silicon dioxide ($SiO_2$) or the like on a semiconductor substrate. The upper surface of an aluminum (Al) layer 13 is exposed as an electrode pad. A copper (Cu) layer 16 is disposed below the aluminum layer 13 and is connected to the aluminum (Al) layer 13 by a plurality of plugs 15 made up of tungsten (W).

In the example illustrated in FIGS. 3A and 3B, a region 13a of the upper surface of the aluminum layer 13 exposed through the opening 12a of the silicon oxide film 11 corresponds to the bonding region of the example illustrated in FIGS. 2A and 2B, and a region 13b of the upper surface of the aluminum layer 13 exposed through the opening 12b corresponds to the test region of the example illustrated in FIGS. 2A and 2B. That is, in the example illustrated in FIGS. 3A and 3B, the bonding region 13a and the test region 13b are disposed with a specific distance therebetween, and it is possible to clearly visually confirm the test region 13b of the electrode pad.

Consequently, in the example illustrated in FIGS. 3A and 3B, during the probing test, it is possible to prevent the probe needle from extending beyond the test region such that a needle mark 5 extends to the bonding region 13a. Therefore, when wire bonding is performed on the bonding region 13a, an alloy layer between, for example, gold (Au) which makes up a bonding wire and aluminum (Al) which is a constituent material of the electrode pad is formed, and thus stable wire bonding may be performed.

An improvement of the above-mentioned technique will be described below. First, a pad structure of a semiconductor element according to each embodiment will be described, and then a method of manufacturing the structure will be described.

[Pad Structure of Semiconductor Element]

1. First Embodiment

Figure 4A:
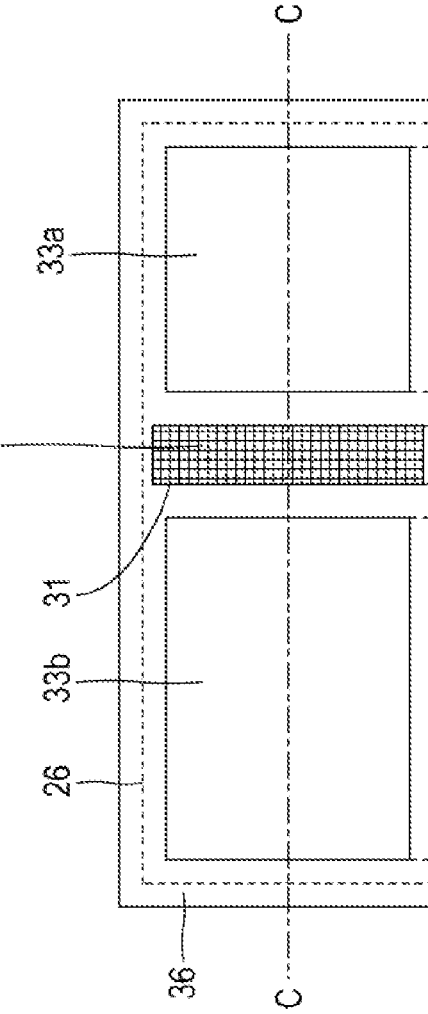
FIGS. 4A and 4B are views illustrating a structure of an electrode pad of a semiconductor element according to a first embodiment of the present invention.
Figure 4B:
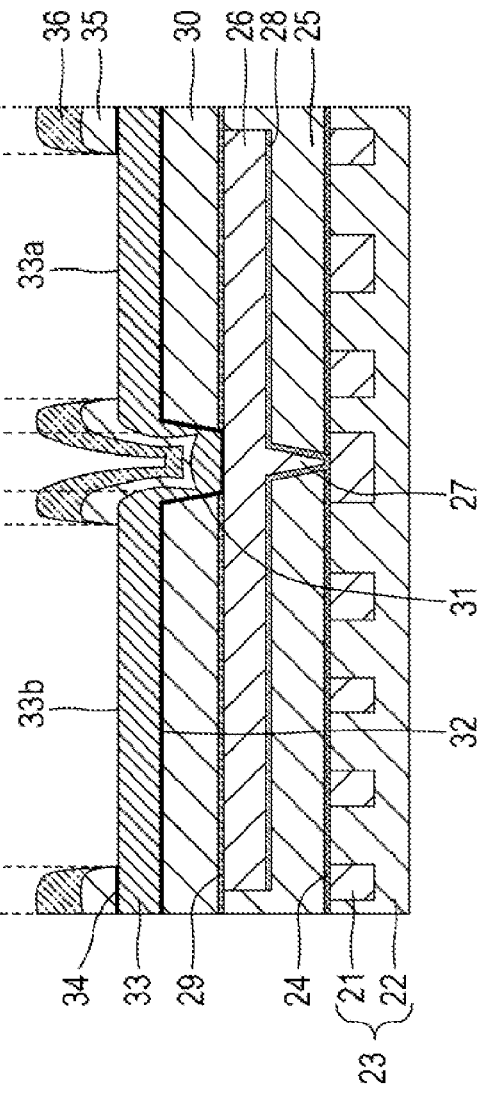

A first embodiment of a pad structure of a semiconductor element will be described with reference to FIGS. 4A and 4B. FIG. 4A is a plan view illustrating an electrode pad according to the first embodiment and a vicinity of the electrode pad, and FIG. 4B is a cross-sectional view taken along the line C-C of FIG. 4A.

In the first embodiment, a copper (Cu) layer (first metal layer) 26 is disposed on a semiconductor substrate. That is, wiring 21, for example, made up of copper (Cu) is disposed in a silicon oxide film 22, for example, made up of silicon dioxide ($SiO_2$) to make up a wiring portion 23. A silicon carbide (SiC) film 24 is disposed on the wiring portion 23. A silicon oxide film 25 made up of silicon dioxide ($SiO_2$) or the like is disposed on the silicon carbide film 24. The copper (Cu) layer 26 is disposed in the upper part of the silicon oxide film 25.

The copper (Cu) layer 26, for example, has a thickness of about 800 nm to about 900 nm. In FIG. 4A, the copper (Cu) layer 26 is indicated by the dotted line.

A via 27 connected to the copper (Cu) layer 26 is formed under the copper (Cu) layer 26. The via 27 is filled with copper (Cu). A tantalum (Ta) layer 28, for example, with a thickness of about 25 nm, is disposed on the lower surfaces of the copper (Cu) layer 26 and the via 27. The via 27 is selectively connected to the wiring 21 with the tantalum (Ta) layer 28 therebetween.

A silicon carbide (SiC) film 29 is disposed on portions of the silicon oxide film 25 in the upper part of which the copper (Cu) layer 26 is not disposed and on the copper (Cu) layer 26. The thickness of the silicon carbide (SiC) film 29 is, for example, about 70 nm.

A silicon oxide film 30 made up of silicon dioxide ($SiO_2$) or the like, as an insulating layer, is further disposed on the silicon carbide (SiC) film 29. The silicon oxide film 30, for example, has a thickness of about 730 nm.

A groove 31, as an example of a recess, is disposed in the silicon oxide film 30. A pad connection layer 32 is disposed on the upper surface of the silicon oxide film 30 and the inner side and bottom faces of the groove 31, the pad connection layer 32, for example, including a tantalum (Ta) layer, a titanium (Ti) layer, and a titanium nitride (TiN) layer laminated in order from the bottom. The thickness of the pad connection layer 32 may be set, for example, such that the tantalum (Ta) layer has a thickness of about 10 nm to about 20 nm, the titanium (Ti) layer has a thickness of about 40 nm, and the titanium nitride (TiN) layer has a thickness of about 30 nm.

A pad-forming portion (second metal layer) 33 made up of aluminum (Al) or an alloy of aluminum (Al) and copper (Cu) is disposed on the upper surface of the pad connection layer 32. The pad-forming portion 33 in the groove 31 has a shape following the groove 31. The pad-forming portion 33, for example, has a thickness of about 1 μm to about 1.5 μm. The copper (Cu) layer 26, the silicon carbide (SiC) film 29, and the silicon oxide film 30, the pad connection layer 32, and the pad-forming portion 33 make up a pad portion.

A titanium nitride (TiN) layer 34, for example, with a thickness of about 50 nm, is disposed on the upper surface of the peripheral part of the pad-forming portion 33 and the upper surface of a part of the pad-forming portion 33 located at the groove 31.

A silicon oxide film 35 made up of silicon dioxide ($SiO_2$) or the like, for example, with a thickness of about 300 nm, and a silicon nitride film 36 made up of silicon dioxide ($Si_3N_4$) or the like, for example, with a thickness of about 500 nm, are disposed as a covering film (insulating film) on the titanium nitride (TiN) layer 34. The silicon oxide film 35 and the silicon nitride film 36 on the groove 31 have a shape that substantially follows the shape of the groove 31.

As described above, in the first embodiment, the upper surface of the pad-forming portion 33 includes exposed sections not covered with the silicon oxide film 35 and the silicon nitride film 36, and the exposed sections are separated from each other by the silicon oxide film 35 and the silicon nitride film 36 disposed on the groove 31.

Among the two exposed sections in the upper surface of the pad-forming portion 33 (electrode pad surface), a narrow region 33a corresponds to a bonding region on which wire bonding is performed, and a broad region 33b corresponds to a test region with which a probe needle is brought into contact in order to conduct a probing test. Each of the bonding region 33a and the test region 33b has a substantially flat surface.

The bonding region 33a and the test region 33b lie adjacent to each other, but are separated by the silicon oxide film 35 and the silicon nitride film 36 disposed on the groove 31. The part of the pad-forming portion 33 located on the groove 31 may be visually observed from above through the silicon oxide film 35 and the silicon nitride film 36.

Consequently, because of the presence of the part of the pad-forming portion 33 located on the groove 31 which may be visually observed from above through the silicon oxide film 35 and the silicon nitride film 36, the boundary between the bonding region 33a and the test region 33b may be seen clearly. Therefore, it is possible to clearly visually confirm the bonding region 33a.

As a result, during a probing test, it is possible to prevent the probe needle from extending beyond the test region 33b so that a needle mark extends to the bonding region 33a. Therefore, when wire bonding is performed on the bonding region 33a, an alloy layer between, for example, gold (Au) which makes up a bonding wire and aluminum (Al) which is a constituent material of the electrode pad is formed, and thus stable wire bonding may be performed.

Furthermore, in the first embodiment, the silicon oxide film 30 is disposed between the copper (Cu) layer 26 disposed above the wiring portion 23 and the pad-forming portion 33 made up of aluminum (Al) or an alloy of aluminum (Al) and copper (Cu). Consequently, when stress is applied onto the pad-forming portion 33 during a probing test or a wire bonding process, even if cracks are generated in the silicon oxide film 30, such cracks are retarded if not prevented from propagating by the copper (Cu) layer 26. Therefore, the cracks do not extend to the wiring portion 23, and occurrence of short-circuiting and the like may be reduced if not prevented.

Consequently, unlike the structure described in Japanese Laid-open Patent Publication No. 2005-251832 or Japanese Laid-open Patent Publication No. 2008-098225, it is not necessary to provide a metal layer between the copper (Cu) layer 26 and the wiring portion 23 in order to prevent propagation of the cracks. Therefore, the structure of the first embodiment may be easily manufactured, and manufacturing costs may be reduced.

Figures 7A, 7B:
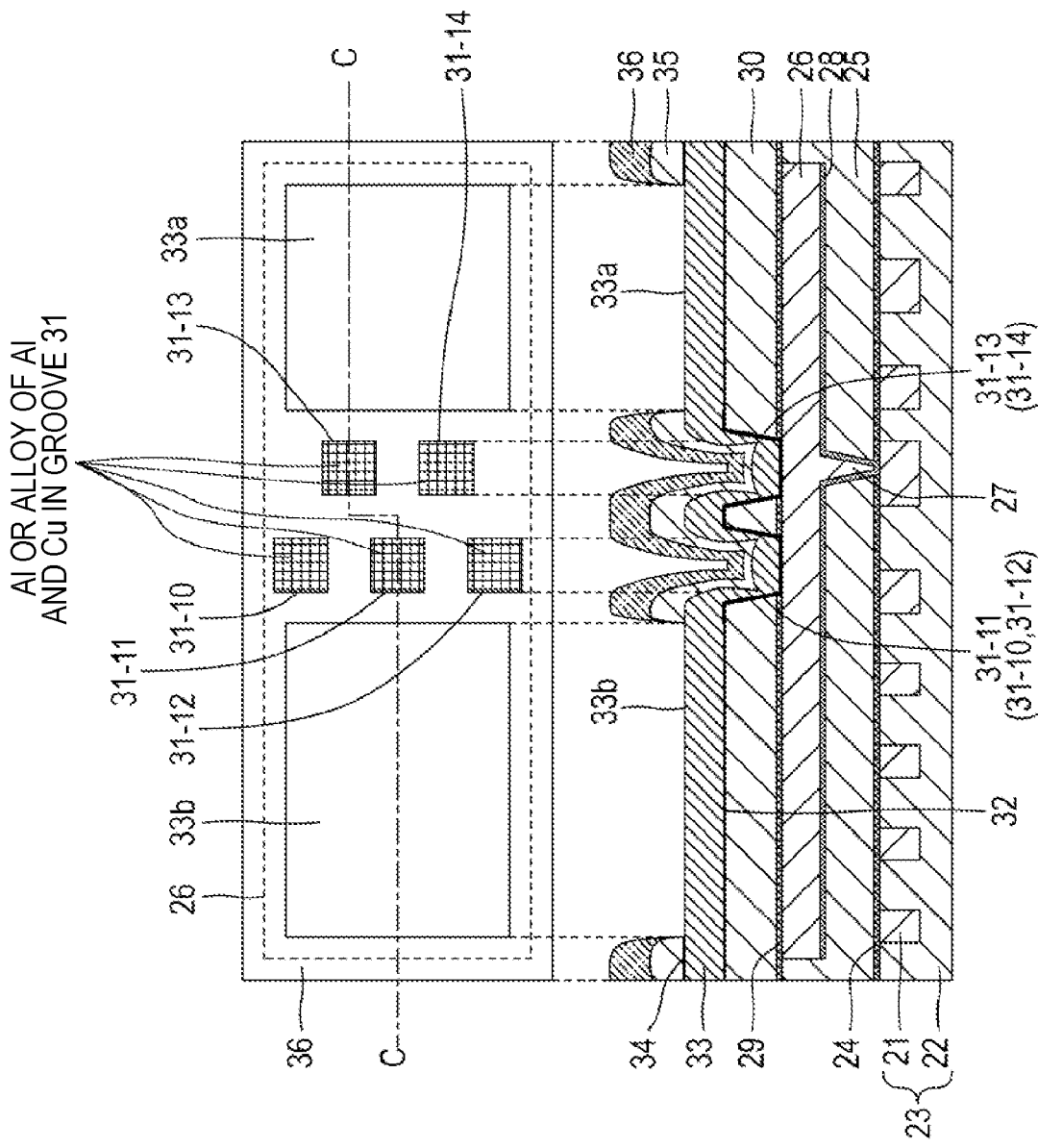
FIGS. 7A and 7B are views illustrating a structure of an electrode pad of a semiconductor element according to a third modification example of the first embodiment of the present invention.

In the example illustrated in FIGS. 4A and 4B, one groove 31 is disposed in the silicon oxide film 30. However, the present invention is not limited to such an example, and structures illustrated in FIGS. 5A and 5B to 7A and 7B may be employed. FIGS. 5A and 5B to 7A and 7B illustrate structures of semiconductor elements according to first to third modification examples of the first embodiment of the present invention. FIGS. 5A, 6A, and 7A are each a plan view illustrating an electrode pad and a vicinity of the electrode pad. FIGS. 5B, 6B, and 7B are cross-sectional views taken along the line C-C of FIGS. 5A, 6A, and 7A, respectively. In FIGS. 5A and 5B to 7A and 7B, the same reference numerals are used to represent the same components as those illustrated in FIGS. 4A and 4B, and a description thereof will be omitted.

In the example illustrated in FIGS. 5A and 5B, grooves 31-1 to 31-3 are disposed in a line in a silicon oxide film 30. The three grooves 31-1 to 31-3 each have a substantially rectangular shape in plan view. For example, the three grooves 31-1 to 31-3 may each have a square shape in plan view or a rectangular shape in plan view. Furthermore, a square/rectangle combination may be used. In the example illustrated in FIGS. 5A and 5B, the number of grooves 31 is not particularly limited as long as it is plural.

A pad-forming portion 33 made up of aluminum (Al) or an alloy of aluminum (Al) and copper (Cu) is disposed in each of the three grooves 31-1 to 31-3, and the pad-forming portion 33 has a shape following each of the grooves 31-1 to 31-3. The silicon oxide film 35 and the silicon nitride film 36 on each groove 31 have a shape that substantially follows the shape of each of the grooves 31-1 to 31-3. Because of the presence of the parts of the pad-forming portion 33 located on the grooves 31-1 to 31-3, the boundary between the bonding region 33a and the test region 33b may be seen clearly.

In the example illustrated in FIGS. 6A and 6B, grooves 31-4 to 31-6 and grooves 31-7 to 31-9 are disposed in a plurality of lines in the silicon oxide film 30. The three grooves 31-4 to 31-6 making up one line and the three grooves 31-7 to 31-9 making up another line each have a substantially rectangular shape in plan view. For example, the three grooves 31-4 to 31-6 and three grooves 31-7 to 31-9 may each have a square shape in plan view or a rectangular shape in plan view. Furthermore, a square/rectangle combination may be used. In the example illustrated in FIGS. 6A and 6B, the number of grooves 31 making up one line is not particularly limited as long as the number of grooves 31 is more than one, and the number of lines is not particularly limited as long as the number of lines is more than one.

A pad-forming portion 33 made up of aluminum (Al) or an alloy of aluminum (Al) and copper (Cu) is disposed in each of the grooves 31-4 to 31-9, and the pad-forming portion 33 has a shape following each of the grooves 31-4 to 31-9. The silicon oxide film 35 and the silicon nitride film 36 on each groove 31 have a shape that substantially follows the shape of each of the grooves 31-4 to 31-9. Because of the presence of the parts of the pad-forming portion 33 located on the grooves 31-4 to 31-9, the boundary between the bonding region 33a and the test region 33b may be seen clearly.

In the example illustrated in FIGS. 7A and 7B, grooves 31-10 to 31-12 and grooves 31-13 and 31-14 are disposed, in the silicon oxide film 30, in a plurality of lines and are also disposed alternately (in a staggered arrangement) in the direction in which the lines extend. The grooves 31-10 to 31-14 each have a substantially rectangular shape in plan view. For example, the grooves 31-10 to 31-14 may each have a square shape in plan view or a rectangular shape in plan view. Furthermore, a square/rectangle combination may be used.

In the example illustrated in FIGS. 7A and 7B, the number of grooves 31 making up one line is not particularly limited as long as the number of grooves 31 is more than one, and the number of lines is not particularly limited as long as the number of lines is more than one.

A pad-forming portion 33 made up of aluminum (Al) or an alloy of aluminum (Al) and copper (Cu) is disposed in each of the grooves 31-10 to 31-14, and the pad-forming portion 33 has a shape following each of the grooves 31-10 to 31-14. The silicon oxide film 35 and the silicon nitride film 36 on each groove 31 have a shape that substantially follows the shape of each of the grooves 31-10 to 31-14. Because of the presence of the parts of the pad-forming portion 33 located on the grooves 31-10 to 31-14, the boundary between the bonding region 33a and the test region 33b may be seen clearly.

As described above, in the examples illustrated in FIGS. 5A and 5B to FIGS. 7A and 7B, the bonding region 33a and the test region 33b are separated by the silicon oxide film 35 and the silicon nitride film 36 disposed on the grooves 31. The parts of the pad-forming portion 33 located on the grooves 31 may be visually observed from above through the silicon oxide film 35 and the silicon nitride film 36.

Consequently, because of the presence of the parts of the pad-forming portion 33 located on the grooves 31 which may be visually observed from above through the silicon oxide film 35 and the silicon nitride film 36, the boundary between the bonding region 33a and the test region 33b may be seen clearly. Therefore, it is possible to clearly visually confirm the bonding region 33a.

As a result, during a probing test, it is possible to reduce if not prevent the probe needle from extending beyond the test region 33b such that a needle mark extends to the bonding region 33a. Therefore, when wire bonding is performed on the bonding region 33a, an alloy layer between, for example, gold (Au) which makes up a bonding wire and aluminum (Al) which is a constituent material of the electrode pad is formed, and thus stable wire bonding may be performed.

Furthermore, the silicon oxide film 30 is disposed between the copper (Cu) layer 26 disposed above the wiring portion 23 and the pad-forming portion 33 made up of aluminum (Al) or an alloy of aluminum (Al) and copper (Cu). Consequently, when stress is applied onto the pad-forming portion 33 during a probing test or a wire bonding process, even if cracks are generated in the silicon oxide film 30, such cracks are retarded if not prevented from propagating by the copper (Cu) layer 26. Therefore, the cracks do not extend to the wiring portion 23, and occurrence of short-circuiting and the like may be reduced if not prevented.

Consequently, unlike the structure described in Japanese Laid-open Patent Publication No. 2005-251832 or Japanese Laid-open Patent Publication No. 2008-098225, it is not necessary to provide a metal layer between the copper (Cu) layer 26 and the wiring portion 23 in order to reduce if not prevent propagation of the cracks. Therefore, the structures illustrated in FIGS. 5A and 5B to FIGS. 7A and 7B may be easily manufactured, and manufacturing costs may be reduced.

2. Second Embodiment

A second embodiment of a pad structure of a semiconductor element will be described with reference to FIGS. 8A and 8B. FIG. 8A is a plan view illustrating an electrode pad according to the second embodiment and a vicinity of the electrode pad, and FIG. 8B is a cross-sectional view taken along the line D-D of FIG. 8A. In FIGS. 8A and 8B, the same reference numerals are used to represent the same components as those illustrated in FIGS. 4A and 4B, and a description thereof will be omitted.

In the first embodiment illustrated in FIGS. 4A and 4B, in the groove 31, the silicon oxide film 35 and the silicon nitride film 36 are disposed as a covering film on the pad-forming portion 33 disposed so as to have a shape that follows the shape of the groove 31.

In contrast, in the second embodiment illustrated in FIGS. 8A and 8B, in a groove 31, a silicon oxide film 35 and a silicon nitride film 36 are not disposed on a pad-forming portion 33 disposed so as to have a shape that follows the shape of the groove 31. The pad-forming portion 33 disposed on the bottom face of the groove 31 is directly exposed. The pad-forming portion 33 disposed on the bottom face of the groove 31 is located at a position lower than the pad-forming portion 33 located in the other portion. Therefore, the pad-forming portion 33 disposed on the bottom face of the groove 31 is slightly dark when viewed from above and may be visually observed.

Among the two exposed sections in the upper surface of the pad-forming portion 33 located on both sides of the groove 31, a narrow region 33a corresponds to a bonding region on which wire bonding is performed, and a broad region 33b corresponds to a test region with which a probe needle is brought into contact in order to conduct a probing test.

The bonding region 33a and the test region 33b lie adjacent to each other, but the boundary between the bonding region 33a and the test region 33b is made clear by the pad-forming portion 33 disposed on the groove 31 and exposed. Thus, it is possible to clearly visually confirm the bonding region 33a.

As a result, during a probing test, it is possible to reduce if not prevent the probe needle from extending beyond the test region 33b such that a needle mark extends to the bonding region 33a. Therefore, when wire bonding is performed on the bonding region 33a, an alloy layer between, for example, gold (Au) which makes up a bonding wire and aluminum (Al) which is a constituent material of the electrode pad is formed, and thus stable wire bonding may be performed.

Furthermore, in the second embodiment, unlike the first embodiment, the silicon oxide film 35 and the silicon nitride film 36 are disposed as a covering film, through a titanium nitride (TiN) layer 34 solely on the upper surface of a peripheral part and its vicinity of the pad-forming portion 33. In the groove 31, the silicon oxide film 35 and the silicon nitride film 36 are not disposed on the pad-forming portion 33 disposed so as to have a shape that follows the shape of the groove 31.

Consequently, compared with the first embodiment illustrated in FIGS. 4A and 4B, it is possible to shorten the distance between the bonding region 33a and the test region 33b, thus decreasing the overall length of the electrode pad. As a result, it may be possible to provide a plurality of electrode pads at high density.

Furthermore, in the second embodiment, as in the first embodiment, the silicon oxide film 30 is disposed between the copper (Cu) layer 26 disposed above the wiring portion 23 and the pad-forming portion 33 made up of aluminum (Al) or an alloy of aluminum (Al) and copper (Cu). Consequently, when stress is applied onto the pad-forming portion 33 during a probing test or a wire bonding process, even if cracks are generated in the silicon oxide film 30, such cracks are retarded if not prevented from propagating by the copper (Cu) layer 26. Therefore, the cracks do not extend to the wiring portion 23, and occurrence of short-circuiting and the like may be reduced if not prevented.

Consequently, unlike the structure described in Japanese Laid-open Patent Publication No. 2005-251832 or Japanese Laid-open Patent Publication No. 2008-098225, it is not necessary to provide a metal layer between the copper (Cu) layer 26 and the wiring portion 23 in order to reduce if not prevent propagation of the cracks. Therefore, the structure of the second embodiment may be easily manufactured, and manufacturing costs may be reduced.

In the example illustrated in FIGS. 8A and 8B, one groove 31 is disposed in the silicon oxide film 30. However, the present invention is not limited to such an example, and structures illustrated in FIGS. 9A and 9B to 11A and 11B may be employed. FIGS. 9A and 9B to 11A and 11B illustrate structures of semiconductor elements according to first to third modification examples of the second embodiment of the present invention. FIGS. 9A, 10A, and 11A are each a plan view illustrating an electrode pad and a vicinity of the electrode pad. FIGS. 9B, 10B, and 11B are cross-sectional views taken along the line D-D of FIGS. 9A, 10A, and 11A, respectively. In FIGS. 9A and 9B to 11A and 11B, the same reference numerals are used to represent the same components as those illustrated in FIGS. 8A and 8B, and a description thereof will be omitted.

In the example illustrated in FIGS. 9A and 9B, grooves 31-15 to 31-17 are disposed in a line in a silicon oxide film 30. The three grooves 31-15 to 31-17 each have a substantially rectangular shape in plan view. For example, the three grooves 31-15 to 31-17 may each have a square shape in plan view or a rectangular shape in plan view. Furthermore, a square/rectangle combination may be used. In the example illustrated in FIGS. 9A and 9B, the number of grooves 31 is not particularly limited as long as the number of grooves 31 is more than one.

A pad-forming portion 33 made up of aluminum (Al) or an alloy of aluminum (Al) and copper (Cu) is disposed in each of the three grooves 31-15 to 31-17, and the pad-forming portion 33 has a shape following each of the grooves 31-15 to 31-17. Because of the presence of the parts of the pad-forming portion 33 located on the grooves 31-15 to 31-17, the boundary between the bonding region 33a and the test region 33b may be seen clearly.

In the example illustrated in FIGS. 10A and 10B, grooves 31-18 to 31-20 and grooves 31-21 to 31-23 are disposed in a plurality of lines in the silicon oxide film 30. The three grooves 31-18 to 31-20 making up one line and the three grooves 31-21 to 31-23 making up another line each have a substantially rectangular shape in plan view. For example, the three grooves 31-18 to 31-20 and three grooves 31-21 to 31-23 may each have a square shape in plan view or a rectangular shape in plan view. Furthermore, a square/rectangle combination may be used. In the example illustrated in FIGS. 10A and 10B, the number of grooves 31 making up one line is not particularly limited as long as the number of grooves 31 is more than one, and the number of lines is not particularly limited as long as the number of lines is more than one.

A pad-forming portion 33 made up of aluminum (Al) or an alloy of aluminum (Al) and copper (Cu) is disposed in each of the grooves 31-18 to 31-23, and the pad-forming portion 33 has a shape following each of the grooves 31-18 to 31-23. Because of the presence of the parts of the pad-forming portion 33 located on the grooves 31-18 to 31-23, the boundary between the bonding region 33a and the test region 33b may be seen clearly.

In the example illustrated in FIGS. 11A and 11B, grooves 31-24 to 31-26 and grooves 31-27 and 31-28 are disposed, in the silicon oxide film 30, in a plurality of lines and are disposed alternately (in a staggered arrangement) in the direction in which the lines extend. The grooves 31-24 to 31-28 each have a substantially rectangular shape in plan view. For example, the grooves 31-24 to 31-28 may each have a square shape in plan view or a rectangular shape in plan view. Furthermore, a square/rectangle combination may be used. In the example illustrated in FIGS. 11A and 11B, the number of grooves 31 making up one line is not particularly limited as long as the number of grooves 31 is more than one, and the number of lines is not particularly limited as long as the number of lines is more than one.

A pad-forming portion 33 made up of aluminum (Al) or an alloy of aluminum (Al) and copper (Cu) is disposed in each of the grooves 31-24 to 31-28, and the pad-forming portion 33 has a shape following each of the grooves 31-24 to 31-28. Because of the presence of the parts of the pad-forming portion 33 located on the grooves 31-24 to 31-28, the boundary between the bonding region 33a and the test region 33b may be seen clearly.

As described above, in the examples illustrated in FIGS. 9A and 9B to FIGS. 11A and 11B, in the grooves 31, a silicon oxide film 35 and a silicon nitride film 36 are not disposed on the pad-forming portion 33 disposed so as to have a shape that follows the shape of the grooves 31. The pad-forming portion 33 disposed on the bottom face of each groove 31 is directly exposed. The pad-forming portion 33 disposed on the bottom face of each groove 31 is located at a position lower than the pad-forming portion 33 located in the other portion. Therefore, the pad-forming portion 33 disposed on the bottom face of each groove 31 is slightly dark when viewed from above and may be visually observed.

Consequently, because of the presence of the exposed parts of the pad-forming portion 33 located on the grooves 31, the boundary between the bonding region 33a and the test region 33b may be seen clearly. Therefore, it is possible to clearly visually confirm the bonding region 33a.

As a result, during a probing test, it is possible to prevent the probe needle from extending beyond the test region 33b such that a needle mark extends to the bonding region 33a. Therefore, when wire bonding is performed on the bonding region 33a, an alloy layer between, for example, gold (Au) which makes up a bonding wire and aluminum (Al) which is a constituent material of the electrode pad is formed, and thus stable wire bonding may be performed.

Furthermore, the silicon oxide film 30 is disposed between the copper (Cu) layer 26 disposed above the wiring portion 23 and the pad-forming portion 33 made up of aluminum (Al) or an alloy of aluminum (Al) and copper (Cu). Consequently, when stress is applied onto the pad-forming portion 33 during a probing test or a wire bonding process, even if cracks are generated in the silicon oxide film 30, such cracks are retarded if not prevented from propagating by the copper (Cu) layer 26. Therefore, the cracks do not extend to the wiring portion 23, and occurrence of short-circuiting and the like may be reduced if not prevented.

Consequently, unlike the structure described in Japanese Laid-open Patent Publication No. 2005-251832 or Japanese Laid-open Patent Publication No. 2008-098225, it is not necessary to provide a metal layer between the copper (Cu) layer 26 and the wiring portion 23 in order to reduce or prevent propagation of the cracks. Therefore, the structures illustrated in FIGS. 9A and 9B to FIGS. 11A and 11B may be easily manufactured, and manufacturing costs may be reduced.

[Method of Manufacturing Pad Structure of Semiconductor Element]

A method of manufacturing the pad structure of the semiconductor element described above will now be described.

The method of manufacturing the structure according to the first embodiment is basically the same as the method of manufacturing the structure according to the second embodiment. Therefore, the method of manufacturing the structure according to the first embodiment will be mainly described below, and steps characteristic to the method of manufacturing the structure according to the second embodiment will be described as appropriate. In FIGS. 12A to 12U, the same reference numerals are used to represent the same components as those illustrated in FIGS. 4A and 4B.

First, using a known method, a wiring portion 23 having a multilayered wiring structure is formed (refer to FIG. 12A). The wiring portion 23 includes a plurality of layers, each layer including a silicon carbide (SiC) film 50, a silicon oxide film 51, for example, made up of silicon dioxide ($SiO_2$), formed as an insulating film on the silicon carbide (SiC) film 50, and a copper (Cu) layer 21 laminated on a tantalum (Ta) layer 52 formed in the silicon oxide film 51.

Using a plasma enhanced chemical vapor deposition (PECVD) process, a silicon carbide (SiC) film 24 and a silicon oxide film 25 are formed in order on the wiring portion 23. A silicon nitride film 53, as an antireflective coating, is further deposited thereon (refer to FIG. 12B).

The silicon carbide (SiC) film 24, for example, has a thickness of about 70 nm. The silicon oxide film 25, for example, has a thickness of about 1,400 nm to about 1,500 nm. The silicon nitride film 53, for example, has a thickness of about 50 nm.

A photoresist layer 54 is formed on the silicon nitride film 53 by a photolithographic technique (refer to FIG. 12C), the photoresist layer 54 having openings corresponding to vias 27 (refer to FIGS. 4A and 4B) which are formed in a subsequent step.

Figure 12D:
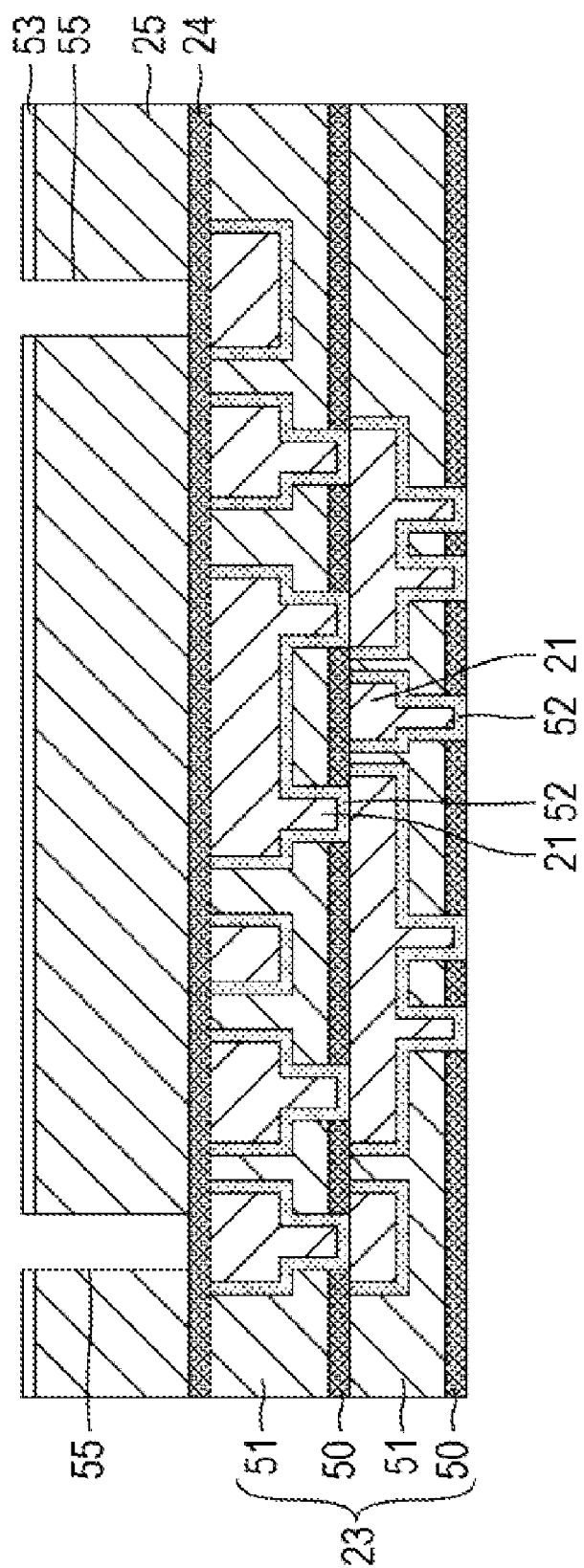
FIG. 12D is a view illustrating a step of manufacturing the electrode pad of the semiconductor element according to the embodiment of the present invention.

Using the photoresist layer 54 as a mask, the silicon oxide film 25 and the silicon nitride film 53 are subjected to dry etching, thereby forming holes 55 that pass through the silicon oxide film 25 and the silicon nitride film 53 (refer to FIG. 12D).

A resin 56, such as a photoresist, is provided in the holes 55 and on the silicon nitride film 53 (refer to FIG. 12E).

Figure 12F:
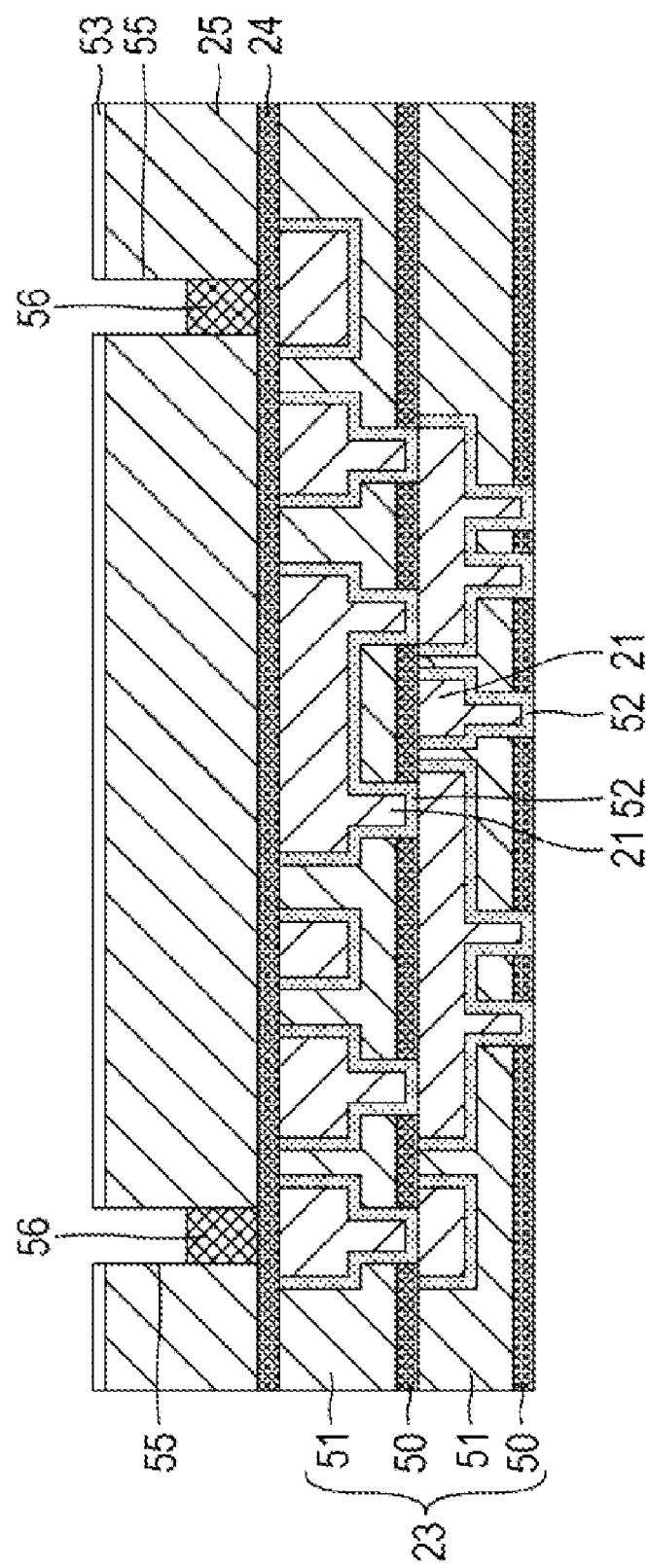
FIG. 12F is a view illustrating a step of manufacturing the electrode pad of the semiconductor element according to the embodiment of the present invention.

The resin 56 provided in the holes 55 and on the silicon nitride film 53 is etched using oxygen ($O_2$) plasma so that the thickness of the resin 56 provided in the holes 55 corresponds to the length in the vertical direction of the via 27 illustrated in FIGS. 4A and 4B (refer to FIG. 12F).

Figure 12G:
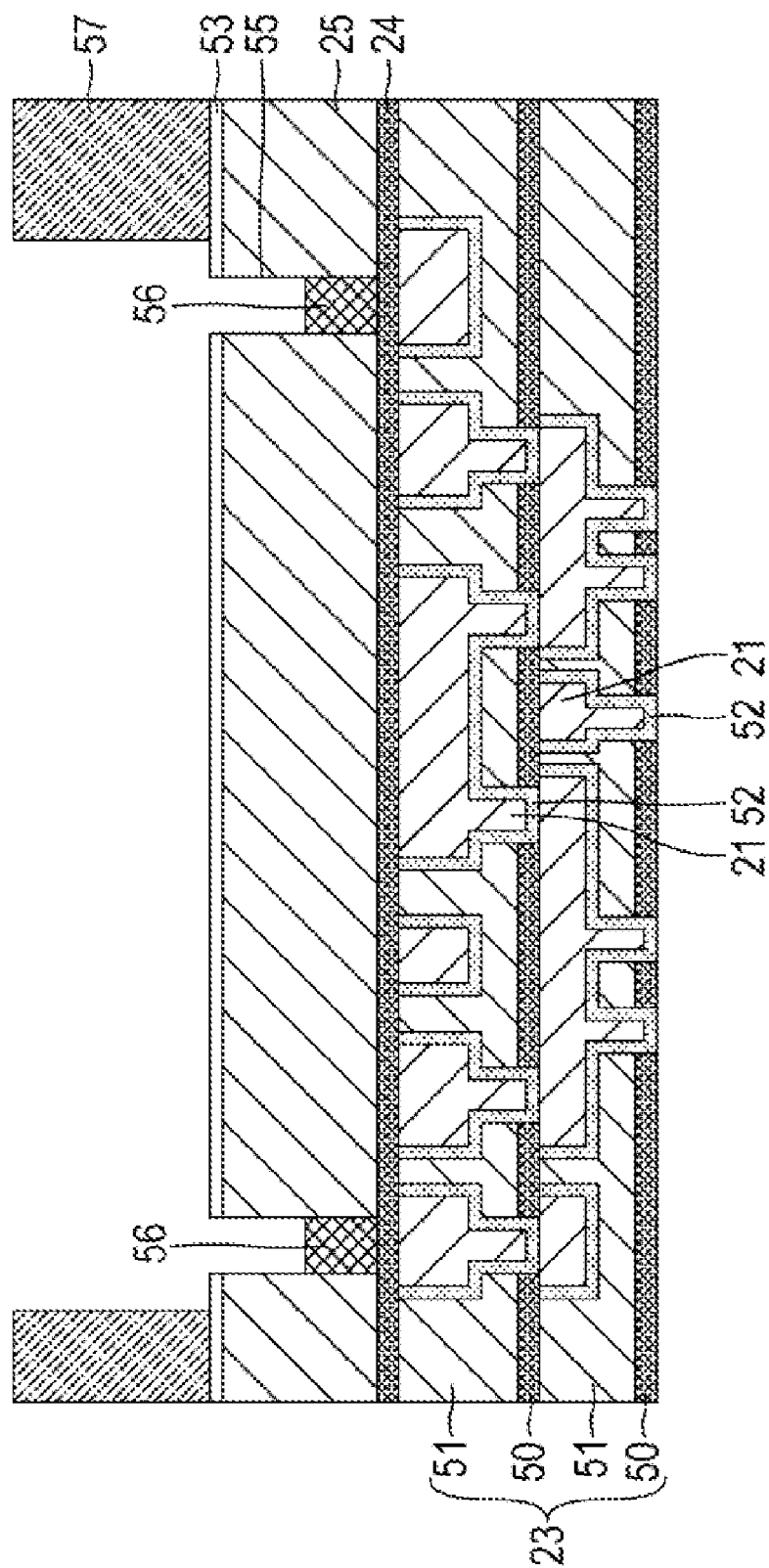
FIG. 12G is a view illustrating a step of manufacturing the electrode pad of the semiconductor element according to the embodiment of the present invention.

A photoresist layer 57 is formed on the silicon nitride film 53 by a photolithographic technique (refer to FIG. 12G), the photoresist layer 57 having an opening corresponding to a copper (Cu) layer 26 (refer to FIGS. 4A and 4B) which is formed in a subsequent step.

Using the photoresist layer 57 as a mask, the silicon oxide film 25 and the silicon nitride film 53 are subjected to dry etching, thereby forming a hole 58 in the silicon oxide film 25 and the silicon nitride film 53 (refer to FIG. 12H).

Figure 12I:
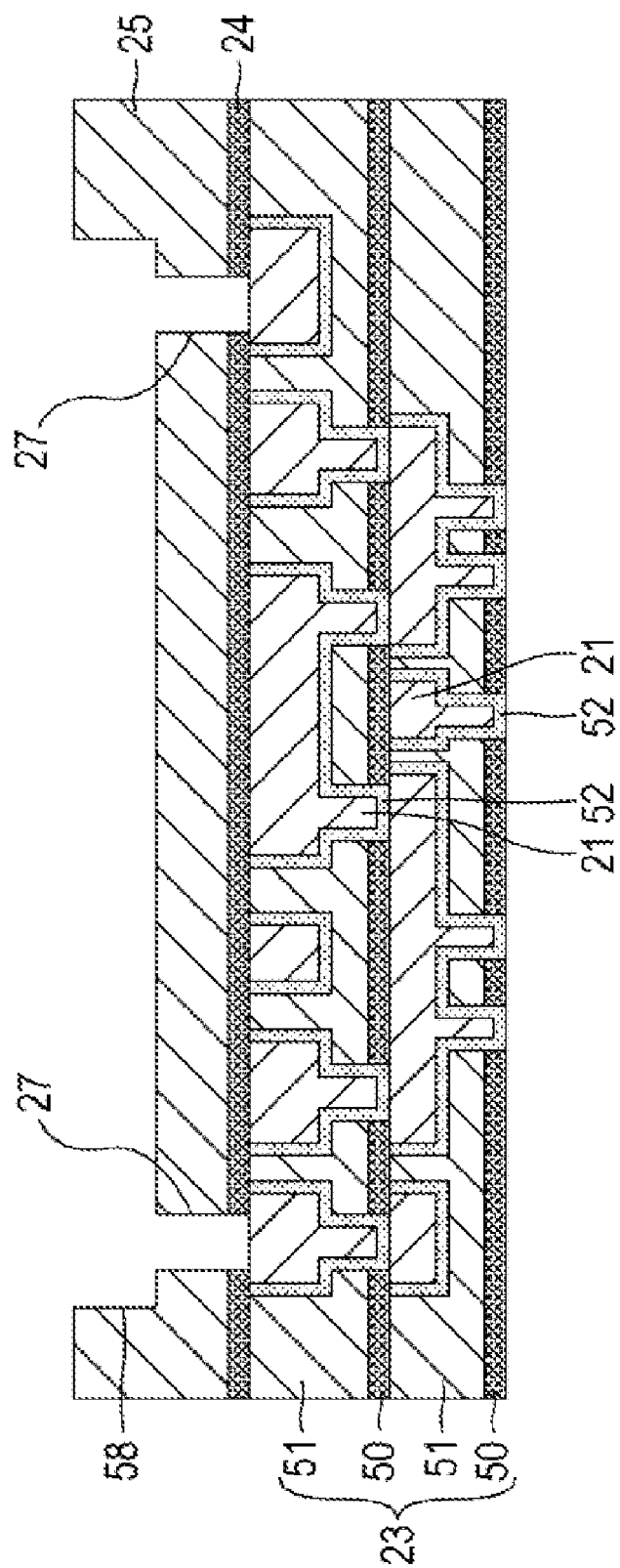
FIG. 12I is a view illustrating a step of manufacturing the electrode pad of the semiconductor element according to the embodiment of the present invention.

The resin 56 in the holes 55, the silicon nitride film 53, and the photoresist layer 57 are stripped away using oxygen/carbon tetrafluoride ($O_2/CF_4$) plasma. When the resin 56 is removed from the holes 55, vias 27 (refer to FIGS. 4A and 4B) are formed. Furthermore, the silicon carbide (SiC) film 24 located on the bottom of each via 27 is removed by dry etching (refer to FIG. 12I).

Figure 12J:
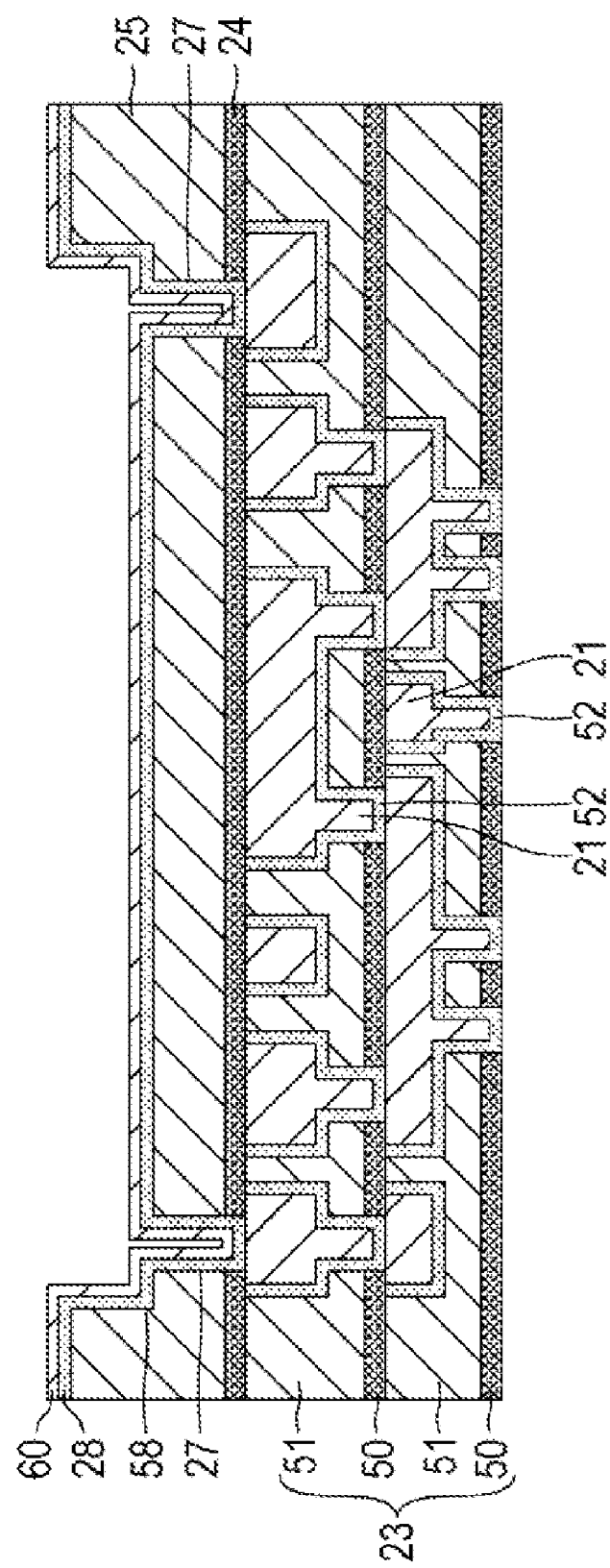
FIG. 12J is a view illustrating a step of manufacturing the electrode pad of the semiconductor element according to the embodiment of the present invention.

A tantalum (Ta) layer 28 and a seed layer 60 for copper (Cu) are deposited by sputtering in order on the silicon oxide film 25 and the inner walls and bottoms of the hole 58 and the vias 27 (refer to FIG. 12J).

The tantalum (Ta) layer 28, for example, has a thickness of about 25 nm. The seed layer for copper (Cu), for example, has a thickness of about 100 nm.

Figure 12K:
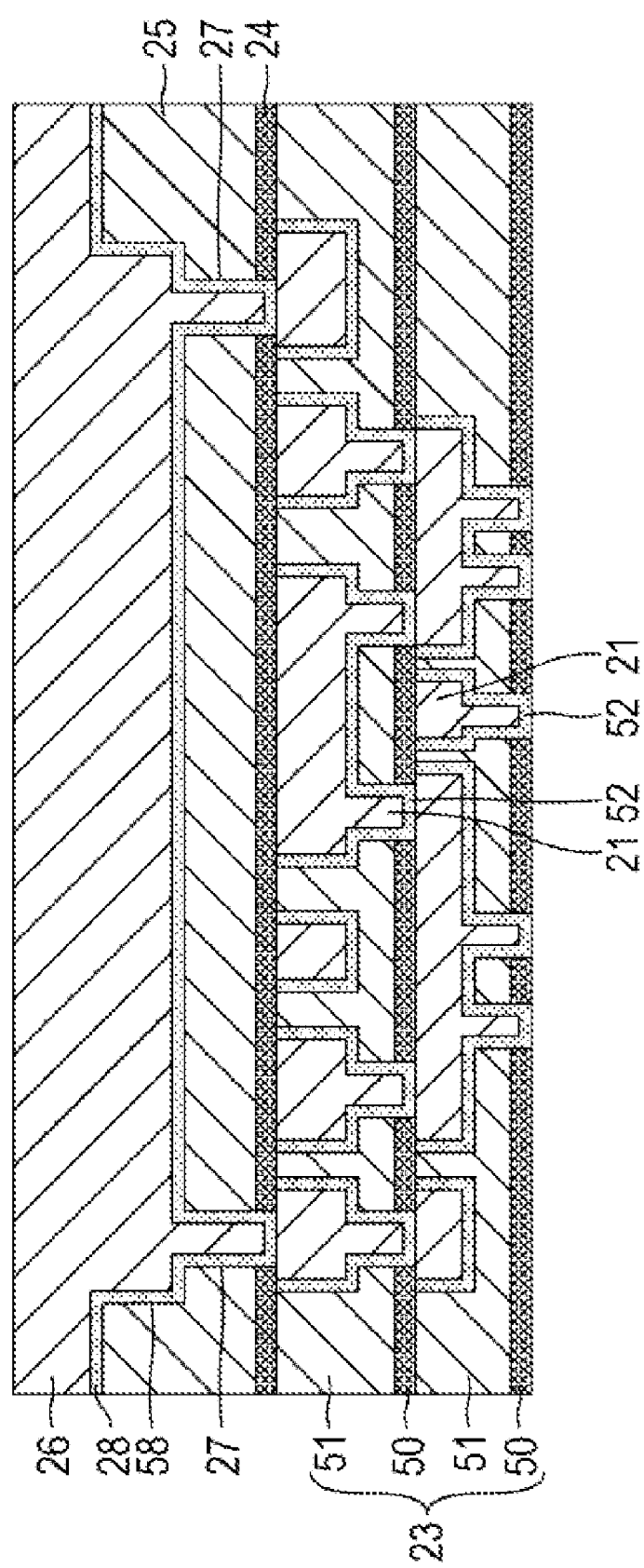
FIG. 12K is a view illustrating a step of manufacturing the electrode pad of the semiconductor element according to the embodiment of the present invention.

A copper (Cu) layer 26 is formed on the tantalum (Ta) layer 28 by electrolytic plating (refer to FIG. 12K).

Figure 12L:
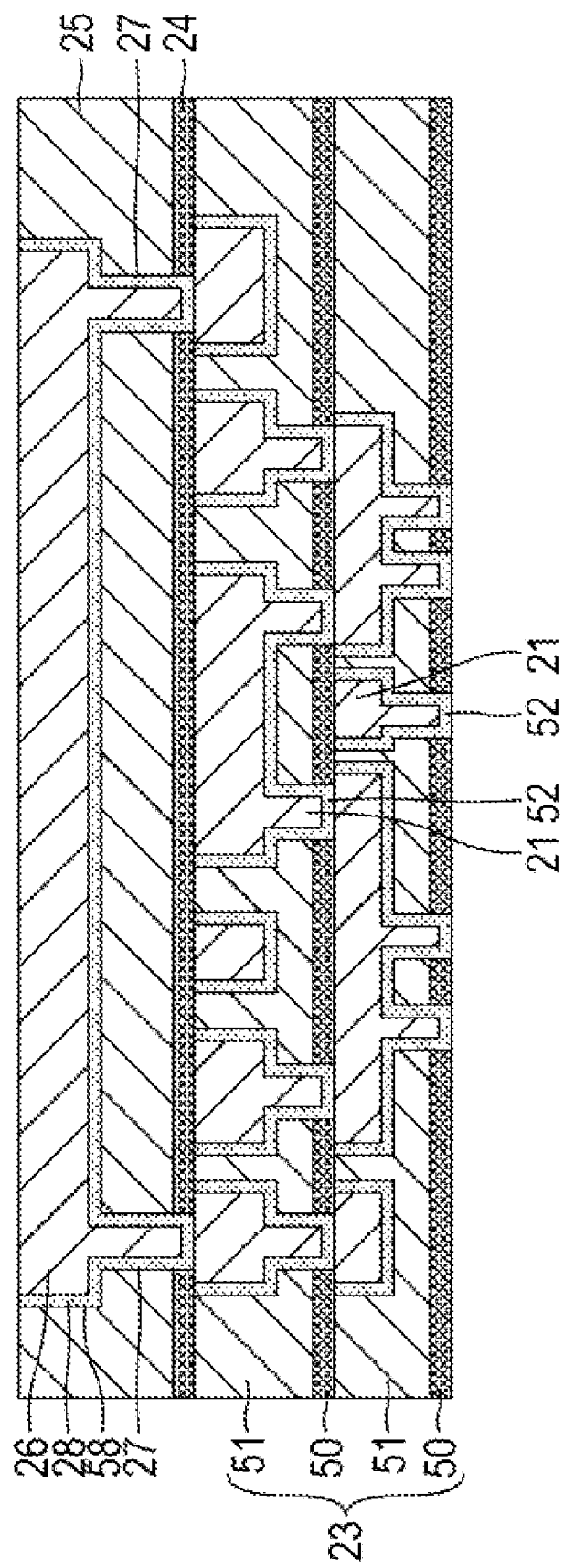
FIG. 12L is a view illustrating a step of manufacturing the electrode pad of the semiconductor element according to the embodiment of the present invention.

The copper (Cu) layer 26 located outside the hole 58 and in the upper part of the hole 58 is removed by chemical mechanical polishing (CMP) so that the thickness of the copper (Cu) layer in the hole 58 is about 800 nm to about 900 nm (refer to FIG. 12L).

A silicon carbide (SiC) film 29 and a silicon oxide film 30 are deposited by a plasma enhanced chemical vapor deposition (PECVD) process in order on the upper surfaces of the silicon oxide film 25, the tantalum (Ta) layer 28, and the copper (Cu) layer 26. A silicon nitride film 61, as an antireflective coating, is further deposited thereon (refer to FIG. 12M).

The silicon carbide (SiC) film 29, for example, has a thickness of about 70 nm. The silicon oxide film 30, for example, has a thickness of about 730 nm. The silicon nitride film 61, for example, has a thickness of about 50 nm.

A photoresist layer 62 is formed on the silicon nitride film 61 by a photolithographic technique (refer to FIG. 12N), the photoresist layer 62 having an opening corresponding to a groove 31 (refer to 4A and 4B) which is formed in a subsequent step.

Using the photoresist layer 62 as a mask, the silicon nitride film 61 and the silicon oxide film 30 are subjected to dry etching, and furthermore, the silicon carbide (SiC) film 29 is subjected to dry etching. Thereby, a groove 31 is formed (refer to FIG. 12O).

Figure 12P:
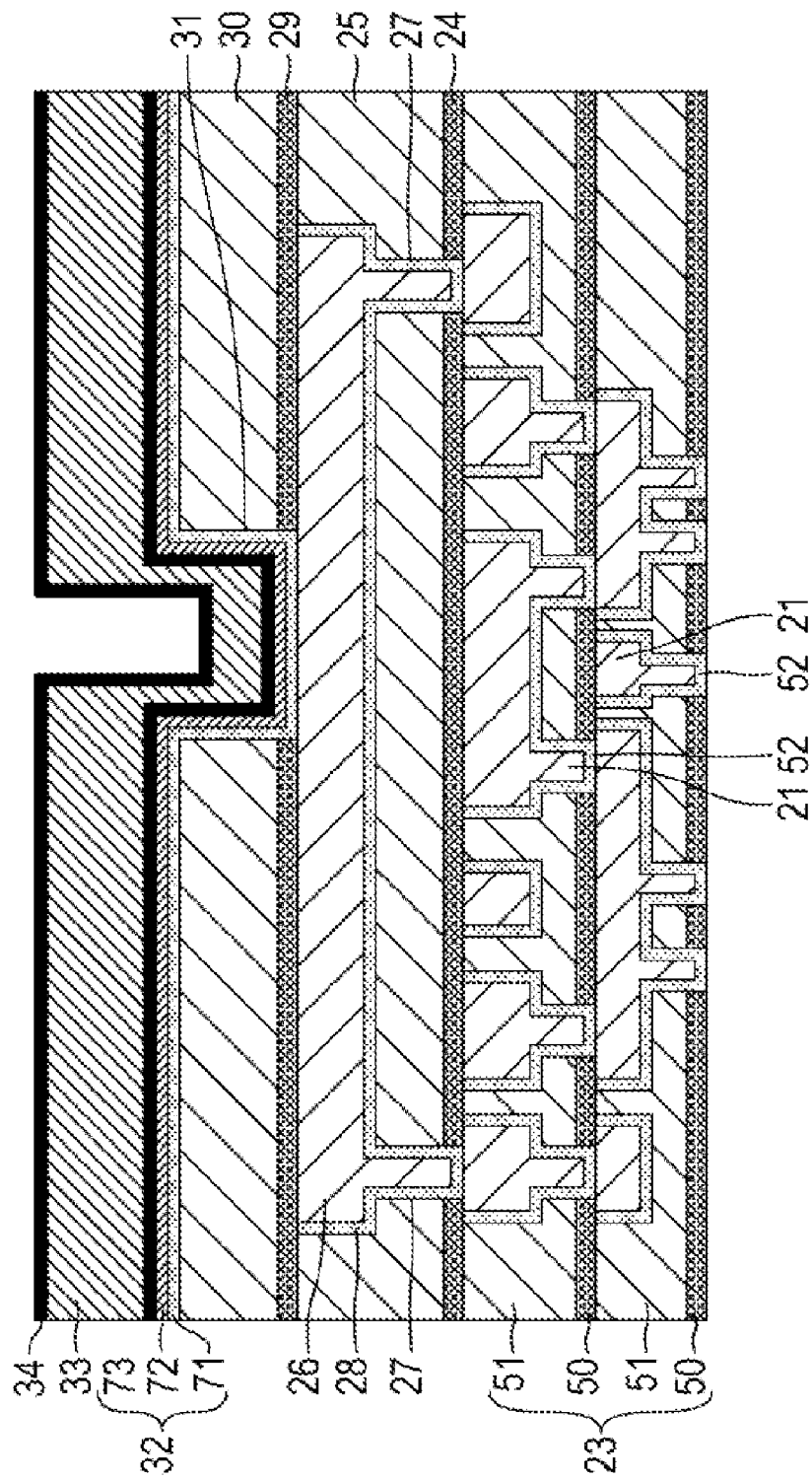
FIG. 12P is a view illustrating a step of manufacturing the electrode pad of the semiconductor element according to the embodiment of the present invention.

A tantalum (Ta) layer 71, a titanium (Ti) layer 72, a titanium nitride (TiN) layer 73, an aluminum (Al) layer 33, and a titanium nitride (TiN) layer 34 are deposited by sputtering on the upper surface of the silicon oxide film 30 and the inner wall and the bottom of the groove 31 (refer to FIG. 12P).

The tantalum (Ta) layer 71, the titanium (Ti) layer 72, the titanium nitride (TiN) layer 73, the aluminum (Al) layer 33, and the titanium nitride (TiN) layer 34 in the groove 31 have a shape that follows the shape of the groove 31. The tantalum (Ta) layer 71, for example, has a thickness of about 10 nm to about 20 nm, the titanium (Ti) layer 72, for example, has a thickness of about 40 nm, and the titanium nitride (TiN) layer 73, for example, has a thickness of about 30 nm. The aluminum (Al) layer 33, for example, has a thickness of about 1 µm, and the titanium nitride (TiN) layer 34, for example, has a thickness of about 50 nm. The tantalum (Ta) layer 71, the titanium (Ti) layer 72, and the titanium nitride (TiN) layer 73 make up a pad connection layer 32.

Figure 12Q:
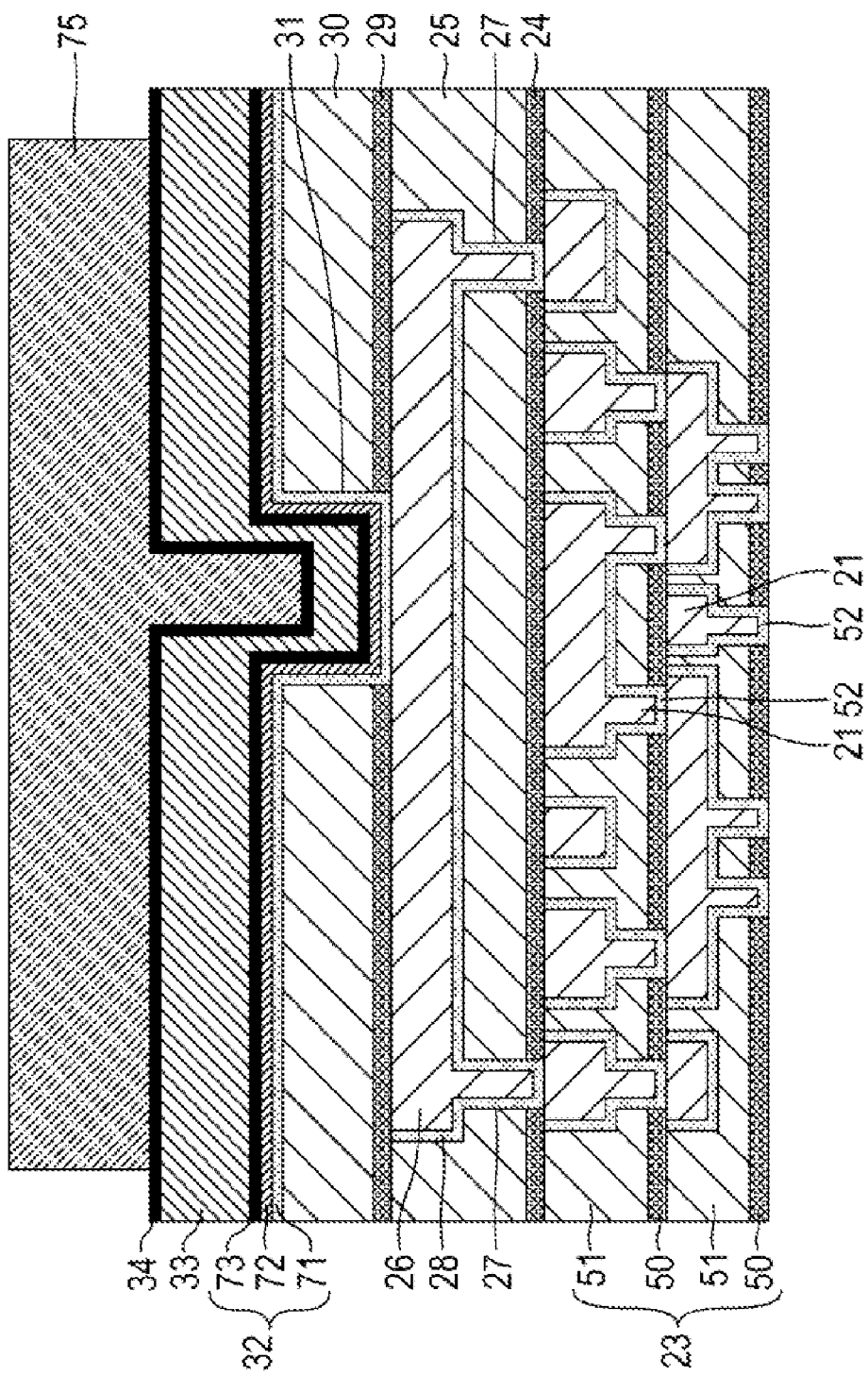
FIG. 12Q is a view illustrating a step of manufacturing the electrode pad of the semiconductor element according to the embodiment of the present invention.

A photoresist layer 75 is formed by a photolithographic technique on the titanium nitride (TiN) layer 34 (refer to FIG. 12Q), the photoresist layer 75 having an opening that follows the outer shape of the pad-forming portion 33 illustrated in FIGS. 4A and 4B.

Figure 12R:
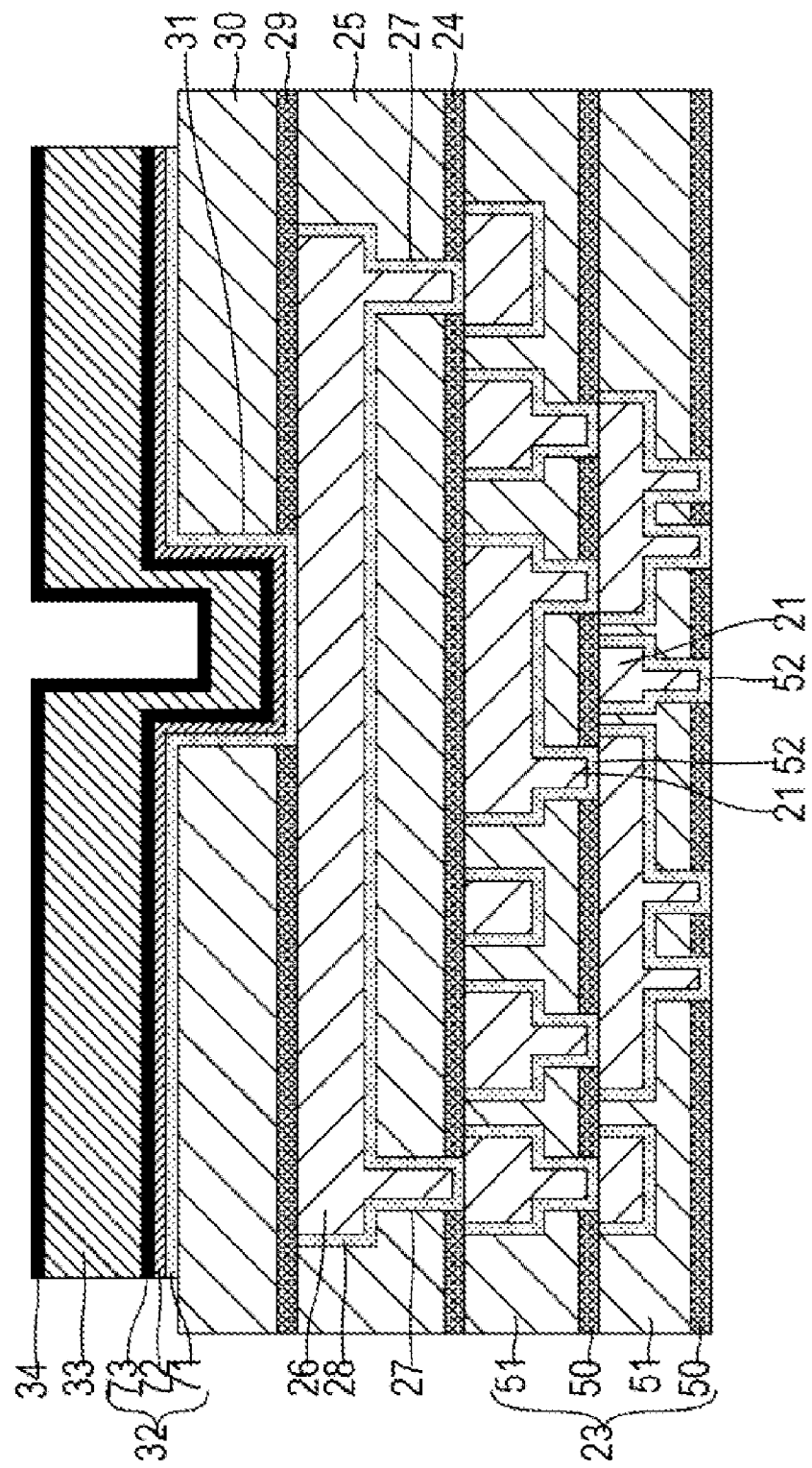
FIG. 12R is a view illustrating a step of manufacturing the electrode pad of the semiconductor element according to the embodiment of the present invention.

Using the photoresist layer 75 as a mask, the tantalum (Ta) layer 71, the titanium (Ti) layer 72, the titanium nitride (TiN) layer 73, the aluminum (Al) layer 33, and the titanium nitride (TiN) layer 34 are subjected to dry etching. Thereby, the pad-forming portion 33 illustrated in 4A and 4B is formed (refer to FIG. 12R).

Figure 12S:
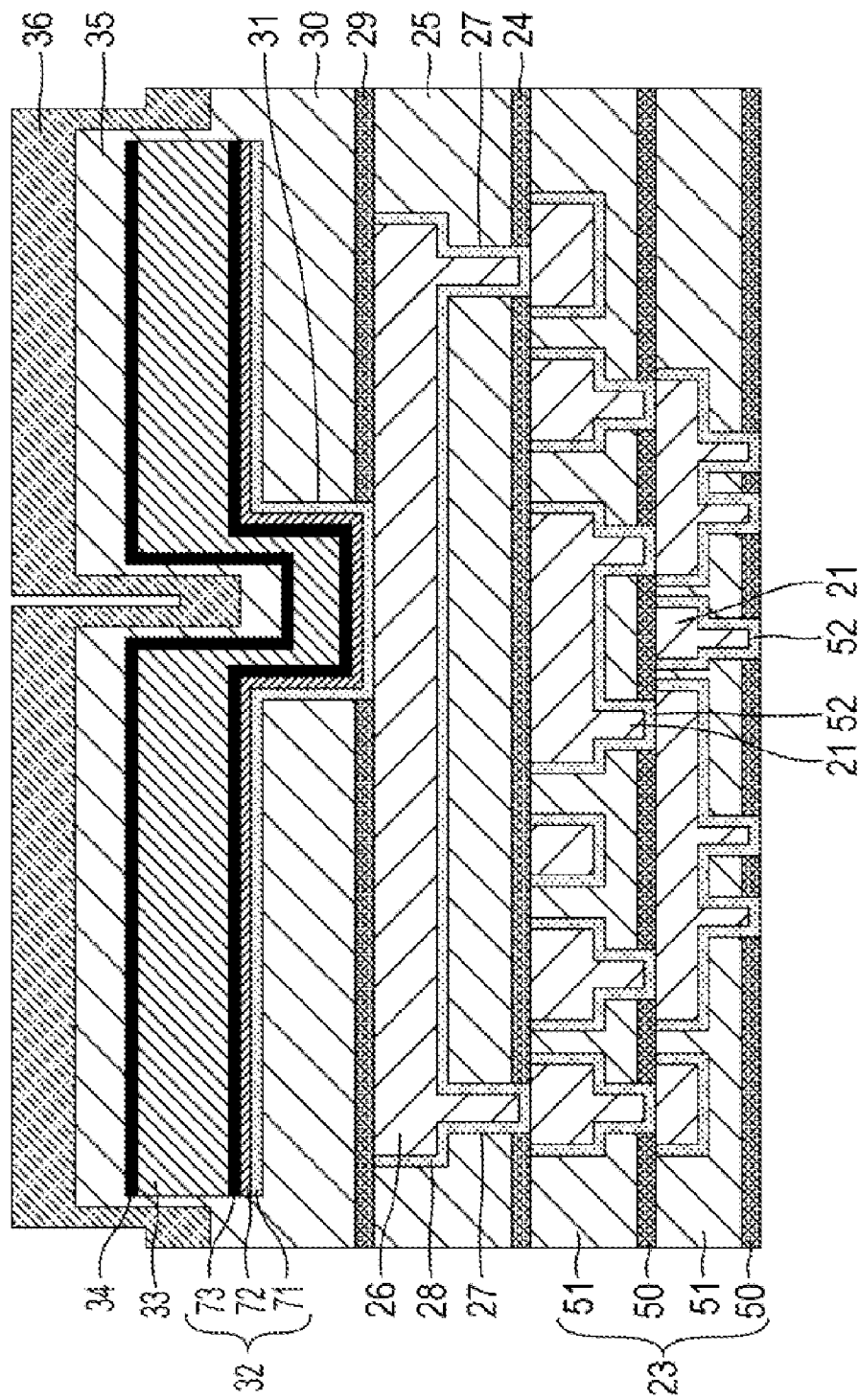
FIG. 12S is a view illustrating a step of manufacturing the electrode pad of the semiconductor element according to the embodiment of the present invention.

A silicon dioxide ($SiO_2$) film 35 and a silicon nitride film 36 are deposited in order, by a chemical vapor deposition (CVD) process on the silicon oxide film 30, on the titanium nitride (TiN) layer 34, and on the side faces of the tantalum (Ta) layer 71, the titanium (Ti) layer 72, the titanium nitride (TiN) layer 73, the aluminum (Al) layer 33, and the titanium nitride (TiN) layer 34 (refer to FIG. 12S).

The silicon oxide film 35 and the silicon nitride film 36 on the groove 31 have a shape that substantially follows the shape of the groove 31. The silicon oxide film 35, for example, has a thickness of about 300 nm to about 500 nm, and the silicon nitride film 36, for example, has a thickness of about 500 nm.

Figure 12T:
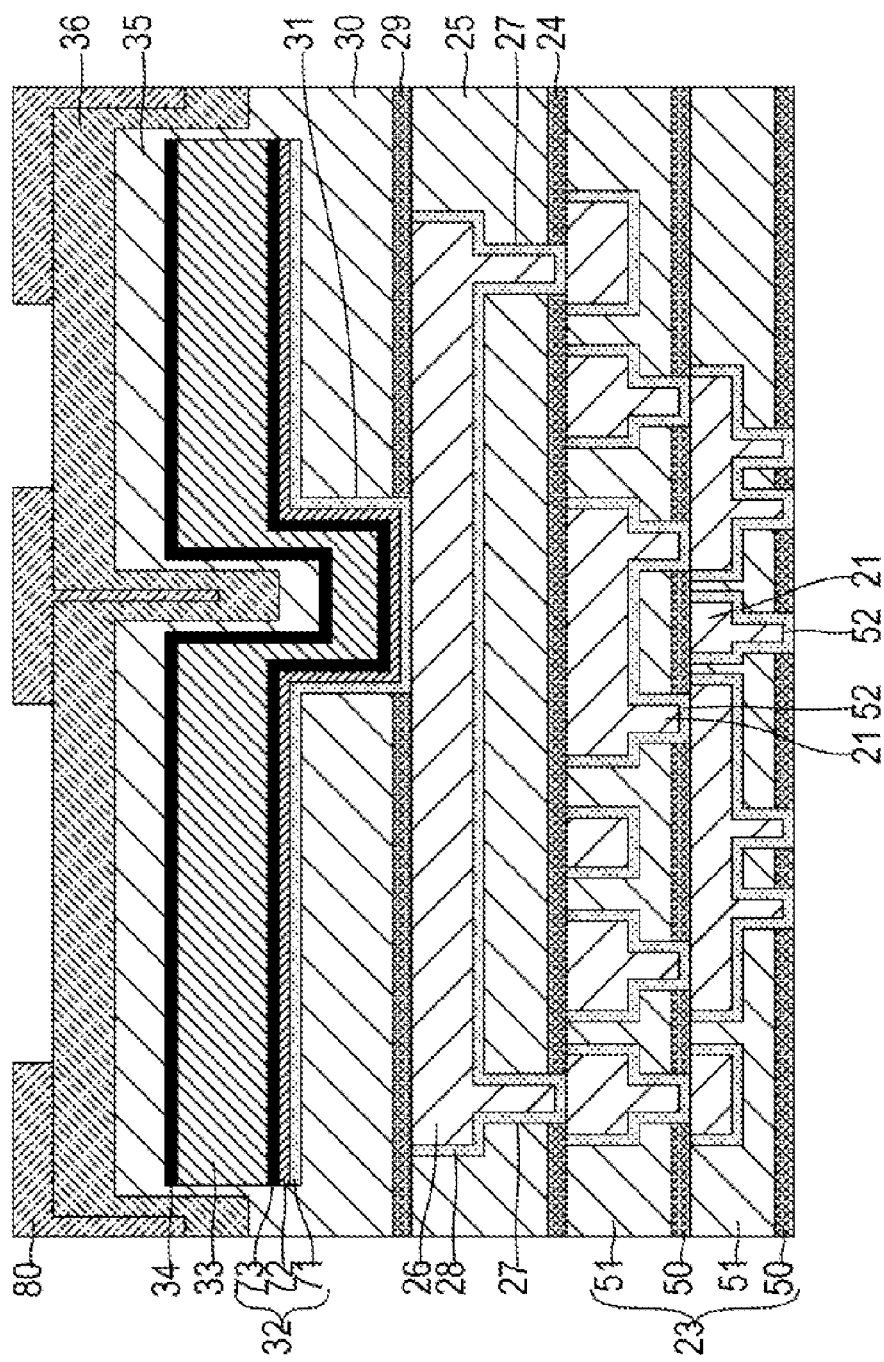
FIG. 12T is a view illustrating a step of manufacturing the electrode pad of the semiconductor element according to the embodiment of the present invention.

A photoresist layer 80 is formed by a photolithographic technique on the silicon nitride film 36 (refer to FIG. 12T), the photoresist layer 80 having openings corresponding to portions to be exposed as a bonding region 33a and a test region 33b (refer to FIGS. 4A and 4B).

Using the photoresist layer 80 as a mask, the titanium nitride (TiN) layer 34, the silicon oxide film 35, and the silicon nitride film 36 are subjected to dry etching to expose the bonding region 33a and the test region 33b. Thereby, the electrode pad structure of the semiconductor element according to the first embodiment of the present invention illustrated in FIGS. 4A and 4B is obtained (refer to FIG. 12U).

When the electrode pad structure of the semiconductor element according to the second embodiment illustrated in FIGS. 8A and 8B is manufactured, in the step illustrated in FIG. 12U, as the photoresist layer 80, a photoresist layer having an opening corresponding to a portion excluding a peripheral part and the vicinity of the peripheral part of the pad-forming portion 33 is formed on the silicon nitride film 36. Using the photoresist layer as a mask, the titanium nitride (TiN) layer 34, the silicon oxide film 35, and the silicon nitride film 36 are subjected to dry etching. As a result, the electrode pad structure of the semiconductor element according to the second embodiment of the present invention is obtained, in which the upper surface of the pad-forming portion 33 is exposed with the boundary between the bonding region 33a and the test region 33b being clearly visually confirmed from above because of the presence of the aluminum 33 provided in the groove 31.

When the structures illustrated in FIGS. 5A and 5B to FIGS. 7A and 7B and the structures illustrated in FIGS. 9A and 9B to FIGS. 11A and 11B are manufactured, in the steps illustrated in FIGS. 12N and 12O, the grooves 31 are formed by setting the number, position, or shape of the grooves 31 to correspond to the examples illustrated in FIGS. 5A and 5B to FIGS. 7A and 7B and the examples illustrated in FIGS. 9A and 9B to FIGS. 11A and 11B. Next, by performing the steps illustrated in FIGS. 12P to 12T, the structures illustrated in FIGS. 5A and 5B to FIGS. 7A and 7B and the structures illustrated in FIGS. 9A and 9B to FIGS. 11A and 11B are obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
    a first metal layer disposed on a semiconductor substrate;
    an insulating layer disposed on the first metal layer;
    a second metal layer disposed on the insulating layer and having a first electrode pad surface and a second electrode pad surface exposed to the outside; and
    a recess is disposed in a boundary between the first electrode pad surface and the second electrode pad surface in the insulating layer and the second metal layer,
    wherein at least the second metal layer is disposed in the recess of the insulating layer.

2. The semiconductor device according to claim 1, wherein the first electrode pad surface is a bonding region on which wire bonding is performed and the second electrode pad surface is a test region with which a probe needle is brought into contact in order to conduct a probing test.

3. The semiconductor device according to claim 1, wherein an insulating film is disposed on a peripheral part of the first and second electrode pad surfaces.

4. The semiconductor device according to claim 3, wherein the insulating film is disposed on the second metal layer.

5. The semiconductor device according to claim 4, wherein the insulating film is disposed on the second metal layer disposed in the recess; and
    a portion of the insulating film disposed on the second metal layer disposed in the recess has a shape that follows the shape of the recess.

6. The semiconductor device according to claim 1, wherein a material making up the first metal layer includes copper.

7. The semiconductor device according to claim 1, wherein a material making up the second metal layer includes aluminum.

8. The semiconductor device according to claim 1, wherein the first and second electrode pad surfaces are substantially flat.

9. The semiconductor device according to claim 1, wherein the recess comprises a plurality of recesses; and
    the plurality of recesses are disposed in a line.

10. The semiconductor device according to claim 1, wherein the recess comprises a plurality of recesses; and
    the plurality of recesses are disposed in a first line and a second line.

11. The semiconductor device according to claim 10, wherein the plurality of recesses are disposed in a staggered arrangement with respect to the first line and the second line.

12. The semiconductor device according to claim 1, wherein the recess has a rectangular shape.

* * * * *